United States Patent
Kasai et al.

(10) Patent No.: US 9,570,663 B2
(45) Date of Patent: Feb. 14, 2017

(54) PIXEL CIRCUIT, ELECTRO-OPTICAL DEVICE, AND ELECTRONIC APPARATUS

(71) Applicant: SEIKO EPSON CORPORATION, Tokyo (JP)

(72) Inventors: Toshiyuki Kasai, Okaya (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/937,384

(22) Filed: Nov. 10, 2015

(65) Prior Publication Data

US 2016/0064635 A1  Mar. 3, 2016

Related U.S. Application Data

(63) Continuation of application No. 13/669,002, filed on Nov. 5, 2012, now Pat. No. 9,251,734.

(30) Foreign Application Priority Data

Nov. 15, 2011  (JP) .................................. 2011-249815

(51) Int. Cl.
*H01L 29/18* (2006.01)
*H01L 33/00* (2010.01)
(Continued)

(52) U.S. Cl.
CPC ......... *H01L 33/62* (2013.01); *G02F 1/136213* (2013.01); *G09G 3/3233* (2013.01);
(Continued)

(58) Field of Classification Search
CPC ............. H01L 27/3258; H01L 27/3262; H01L 27/3265; G02F 1/136213
(Continued)

(56) References Cited

U.S. PATENT DOCUMENTS 6,057,897 A    5/2000  Ichikawa et al.
6,078,368 A    6/2000  Ichikawa et al.
(Continued)

FOREIGN PATENT DOCUMENTS

CN    101897025 A    11/2010
JP    H10-177190 A    6/1998
(Continued)

OTHER PUBLICATIONS

Feb. 13, 2015 Office Action issued in U.S. Appl. No. 13/669,002.
Sep. 18, 2015 Notice of Allowance issued in U.S. Appl. No. 13/669,002.
Jul. 15, 2015 Notice of Allowance issued in U.S. Appl. No. 13/669,002.

*Primary Examiner* — Matthew E Warren
(74) *Attorney, Agent, or Firm* — Oliff PLC

(57) ABSTRACT

An electro-optical device formed on a semiconductor substrate, includes: a first transistor controlling a current level according to a voltage between a gate and a source; a second transistor electrically connected between a data line and the gate of the first transistor; a third transistor electrically connected between the gate and a drain of the first transistor; and a light-emitting element emitting light at a luminance according to the current level, in which one of a source and a drain of the second transistor and one of a source and a drain of the third transistor are formed by a common diffusion layer.

10 Claims, 21 Drawing Sheets

(51) Int. Cl.
  *H01L 33/62* (2010.01)
  *H01L 29/786* (2006.01)
  *H01L 29/417* (2006.01)
  *H01L 29/10* (2006.01)
  *H01L 27/32* (2006.01)
  *G02F 1/1362* (2006.01)
  *G09G 3/32* (2016.01)
  *H01L 27/12* (2006.01)

(52) U.S. Cl.
  CPC ........ *H01L 27/124* (2013.01); *H01L 27/1255* (2013.01); *H01L 27/3258* (2013.01); *H01L 27/3262* (2013.01); *H01L 27/3265* (2013.01); *H01L 29/1033* (2013.01); *H01L 29/41725* (2013.01); *H01L 29/78618* (2013.01); *G09G 2300/0819* (2013.01); *G09G 2300/0852* (2013.01); *G09G 2320/0233* (2013.01); *G09G 2320/045* (2013.01); *H01L 27/3244* (2013.01)

(58) Field of Classification Search
  USPC ..................................................... 257/79, 88
  See application file for complete search history.

(56) References Cited

U.S. PATENT DOCUMENTS

| | | | |
|---|---|---|---|
| 6,163,352 | A | 12/2000 | Ichikawa et al. |
| 6,445,026 | B1* | 9/2002 | Kubota ................. G11C 11/403 257/296 |
| 2002/0104995 | A1* | 8/2002 | Yamazaki ........... H01L 27/3246 257/72 |
| 2004/0251953 | A1 | 12/2004 | Yamazaki et al. |
| 2005/0139884 | A1* | 6/2005 | Lane ..................... G11C 11/405 257/296 |
| 2008/0111766 | A1 | 5/2008 | Uchino et al. |
| 2010/0220117 | A1 | 9/2010 | Kimura |
| 2011/0128211 | A1* | 6/2011 | Ono .................... H01L 27/3265 345/76 |

FOREIGN PATENT DOCUMENTS

| | | |
|---|---|---|
| JP | 2008-122634 A | 5/2008 |
| JP | 2009-288435 A | 12/2009 |
| JP | 2010-224532 A | 10/2010 |
| WO | 2009-075740 A1 | 6/2009 |

* cited by examiner

<(a) LIGHT EMITTING PERIOD>

<(b) INITIALIZATION PERIOD>

<(c) COMPENSATION PERIOD>

<(a) LIGHT EMITTING PERIOD>

<(b) INITIALIZATION PERIOD>

<(c) COMPENSATION PERIOD>

<(d) WRITING PERIOD>

(12)  United States Patent
US 9,570,663 B2

PIXEL CIRCUIT, ELECTRO-OPTICAL DEVICE, AND ELECTRONIC APPARATUS

This is a Continuation application of U.S. patent application Ser. No. 13/669,002, which is a Non-Provisional application filed Nov. 5, 2012 which claims priority to Japanese Patent Application No. 2011-249815, filed Nov. 15, 2011. The disclosures of these prior applications are hereby incorporated by reference herein in their entirety.

BACKGROUND

1. Technical Field

The present invention relates to an electro-optical device and an electronic apparatus useful when a pixel circuit is miniaturized, for example.

2. Related Art

In recent years, various types of electro-optical devices using light-emitting elements such as organic light emitting diodes (below, "OLED") have been proposed. In such electro-optical devices, pixel circuits including the above-described light-emitting elements, transistors, and the like corresponding to intersections of scanning lines and data lines are generally configured to be provided corresponding to the pixels of the image to be displayed. In such a configuration, when a data signal of a potential according to the gradation level of the pixels is applied to the gate of the transistor, the transistor supplies current according to the voltage between the gate and the source to the light-emitting element. In this manner, the light-emitting element emits light with a luminance according to the gradation level.

For such electro-optical devices, there is great demand for reduction of the display size and an increase in the high definition of the display. In order to achieve both reduction of the display size and an increase in the high definition of the display, since there is a need to miniaturize the pixel circuit, a technique providing the electro-optical device on a silicon integrated circuit, for example, has also been proposed (for example, refer to JP-A-2009-288435).

Here, when the pixel circuit is miniaturized, it is necessary to control the current supplied to the light-emitting element within a micro region. The current supplied to the light-emitting element is controlled according to the voltage between the gate and the source of the transistor; however, in the micro region, the current supplied to the light-emitting element changes greatly with respect to slight changes in the voltage between the gate and the source.

On the other hand, when the pixel circuit is miniaturized, since the capacitance for holding the voltage between the gate and the source is also reduced, when an electrical charge is drawn from the capacitance, there is a problem in that, without being able to maintain the voltage between the gate and the source, the light-emitting element becomes unable to emit light at a luminance according to the gradation level.

SUMMARY

An advantage of some aspects of the invention is that it provides a pixel circuit, an electro-optical device, and an electronic apparatus capable of supplying current to a light-emitting element with high precision when the pixel circuit is miniaturized.

According to an aspect of the invention, there is provided a pixel circuit which is formed on a semiconductor substrate and includes a driving transistor having a first gate, a first drain, and a first source, the first transistor controlling a current level according to a voltage between the first gate and the first source; a writing transistor through which the first gate of the first transistor is electrically connected to a data line during the writing transistor is in an on-state, the writing transistor having a second gate, a second drain, and a second source; a threshold compensation transistor through which the first gate of the first transistor is electrically connected to the first drain of the first transistor during the threshold compensation transistor is in an on-state, the threshold compensation transistor having a third gate, a third drain, and a third source; and a light-emitting element emitting light at a luminance according to the current level, in which one of the second source and the second drain of the writing transistor and one of the third source and the third drain of the threshold compensation transistor are formed by a common diffusion layer. According to an aspect of the invention, there is provided a pixel circuit which is formed on a semiconductor substrate and includes a driving transistor driving current according to the voltage between a gate and a source; a writing transistor electrically connected between a data line and a gate of the driving transistor; a threshold compensation transistor electrically connected between the gate and a drain of the driving transistor; a first storage capacitor of which one end is electrically connected to the gate of the driving transistor, and which holds a voltage between the gate and the source of the driving transistor; and a light-emitting element emitting light at a luminance according to the size of a current supplied from the driving transistor, in which one of the source and the drain of the writing transistor and one of the source and the drain of the threshold compensation transistor are formed by a common diffusion layer.

According to the aspect of the invention, since one of the source and the drain of the writing transistor and one of the source and the drain of the threshold compensation transistor are formed by a common diffusion layer, in comparison with a case where the writing transistor and the threshold compensation transistor are formed by different diffusion layers, it is possible to reduce the transfer (leakage current) of the electrical charge from the first storage capacitor through the diffusion layer to the N well formed on the semiconductor substrate. In this manner, the changes of the voltage between the gate and the source of the driving transistor caused by the leakage current are reduced, and the driving transistor is able to supply a current with an accurate magnitude according to the gradation level to the light-emitting element.

In addition, it is preferable that the above-described pixel circuit further include an initialization transistor electrically connected between the potential line to which a predetermined potential is supplied and the light-emitting element.

According to the aspect of the invention, it is possible to suppress the influence of the holding voltage of the capacitor having a parasitic capacitance upon the light-emitting element.

In addition, it is preferable that the above-described pixel circuit further include a light-emitting control transistor electrically connected between the driving transistor and the light-emitting element.

According to the aspect of the invention, it is possible to control the period in which the light-emitting element emits light.

In addition, according to another aspect of the invention, in the electro-optical device, a plurality of scanning lines extending in a first direction, a plurality of data lines extending in a second direction and a plurality of pixel circuits provided corresponding to intersections of the scanning lines and the data lines are formed on a semiconductor substrate, and each of the plurality of pixel circuits is a pixel circuit according to any one of the first to third aspects.

According to the aspect of the invention, it is possible to reduce changes in the voltage between the gate and the source of the driving transistor caused by the leakage current and the driving transistor is able to supply a current with an accurate magnitude according to the gradation level to the light-emitting element.

In addition, it is preferable that the above-described electro-optical device further include a plurality of first signal lines extending in the first direction, in which the gate of the threshold compensation transistor is electrically connected to the first signal lines and the gate of the writing transistor is electrically connected to the scanning lines, and, when a straight line in which the distances from the scanning lines and the first signal lines electrically connected to the same pixel circuit in the plurality of scanning lines and the plurality of first signal lines are equal is set as a center line, connection wiring in which the common diffusion layer and the gate of the driving transistor are electrically connected is provided between the scanning lines and the first signal lines electrically connected to the same pixel circuit and intersects the center line when viewed from a direction orthogonal to the semiconductor substrate.

According to the aspect of the invention, the gap between the connection wiring and the first signal lines and the scanning lines is increased, and it is possible to prevent the capacitors between the connection wiring and the first signal lines or between the connection wiring and the scanning lines from having a parasitic capacitance. In this manner, the influence of potential fluctuations generated in the scanning line and the first signal line is prevented from reaching the gate of the driving transistor through the connection wiring.

Therefore, according to the aspect of the invention, the potential of the gate of the driving transistor can be prevented from fluctuating due to the influence of potential fluctuations generated in the scanning lines and the first signal lines and the driving transistor is able to supply a current with an accurate magnitude according to the gradation level to the light-emitting element.

In addition, it is preferable that, in the above-described electro-optical device, each of the common diffusion layer and gate of the driving transistor is provided between the scanning lines and the first signal lines electrically connected to the same pixel circuit and intersects the center line when viewed from a direction orthogonal to the semiconductor substrate.

According to the aspect of the invention, since it is possible to prevent the influence of potential fluctuations generated in the scanning line and the first signal line from reaching the gate of the driving transistor through the connection wiring, the driving transistor is able to supply a current with an accurate magnitude according to the gradation level to the light-emitting element.

In addition, it is preferable that, in the above-described electro-optical device, when the minimum value of a gap between the connection wiring, the gate of the driving transistor, and the common diffusion layer, and the first signal lines is set as a first gap and the minimum value of a gap between the connection wiring, the gate of the driving transistor, and the common diffusion layer, and the scanning lines is set as a second gap, the first gap and the second gap be equal.

According to the aspect of the invention, since it is possible to prevent the influence of potential fluctuations generated in the scanning line and the first signal line from reaching the gate of the driving transistor through the connection wiring, the driving transistor is able to supply a current with an accurate magnitude according to the gradation level to the light-emitting element.

In addition, it is preferable that the above-described electro-optical device further include a second storage capacitor of which one end is electrically connected to the data lines and which holds the potential of the data lines, and a third storage capacitor of which one end is connected to the data lines and to which a data signal of a potential regulating the luminance of the light-emitting element is supplied to the other end.

According to the aspect of the invention, the data signal of the potential regulating the luminance of the light-emitting element is supplied to one end of the third storage capacitor. As well as being connected to the other end of the third storage capacitor, the data lines are connected to one end of the second storage capacitor. Accordingly, the range of the potential fluctuations of the data lines becomes a value in which the range of the potential fluctuations of the data signal is compressed according to the capacitance ratio of the third storage capacitor with respect to the second storage capacitor. Since the second storage capacitor has a large capacitance, the range of potential fluctuations of the data lines is compressed to be sufficiently small in comparison with the range of the potential fluctuations of the data signal. In this manner, even without cutting up the data signal with fine precision, it is possible to supply current with high precision with respect to the light-emitting element.

Here, in addition to the electro-optical device, the invention can be conceived as an electronic apparatus having the electro-optical device. Examples of the electronic apparatus typically include display apparatuses such as a head mounted display (HMD), or an electronic viewfinder.

BRIEF DESCRIPTION OF THE DRAWINGS

The invention will be described with reference to the accompanying drawings, wherein like numbers reference like elements.

FIG. 21 is a perspective view showing an HMD using the electro-optical device according to the embodiments and the like.

DESCRIPTION OF EXEMPLARY EMBODIMENTS

Below, aspects for embodying the invention will be described with reference to the drawings.

First Embodiment

Figure 1:
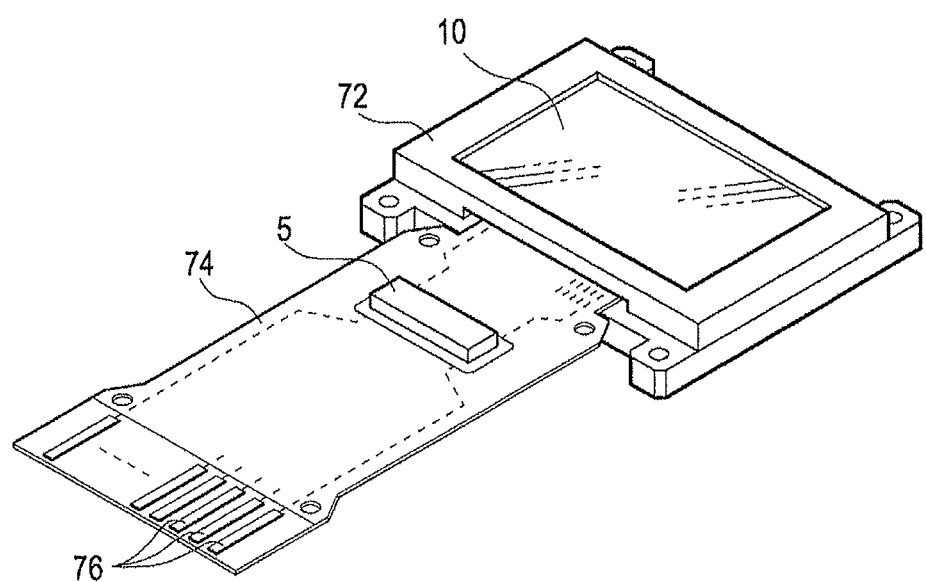
FIG. 1 is a perspective view showing a configuration of an electro-optical device according to a first embodiment of the invention.

FIG. 1 is a perspective view showing a configuration of an electro-optical device 10 according to an embodiment of the invention.

For example, the electro-optical device 10 is a micro display displaying an image in a head mounted display. Detailed description will be given of the electro-optical device 10 later; however, the device is an organic EL apparatus in which a plurality of pixel circuits and driving circuits or the like driving the pixel circuits are formed on a silicon substrate, for example, in which an OLED which is an example of a light-emitting element is used in the pixel circuits.

The electro-optical device 10 is accommodated in an opening in a display unit or a see-through frame-shaped case 72, and one end of an FPC (Flexible Printed Circuit) substrate 74 is connected thereto. In the FPC substrate 74, a control circuit 5 of a semiconductor chip is mounted using a COF (Chip On Film) technique and a plurality of terminals 76 are provided and connected to a high-order circuit omitted from the drawings. Image data is synchronized with a synchronization signal and supplied from the high-order circuit through the plurality of terminals 76. The synchronization signal includes a vertical synchronization signal, a horizontal synchronization signal, and a dot clock signal. In addition, the image data regulates the gradation level of the pixels of the image to be displayed using 8 bits, for example.

The control circuit 5 combines the functions of a power circuit of the electro-optical device 10 and a data signal output circuit. That is, in addition to supplying each type of control signal and various types of potential generated in accordance with the synchronization signal to the electro-optical device 10, the control circuit 5 converts the digital image data to an analog data signal and performed supply thereof to the electro-optical device 10.

Figure 2:
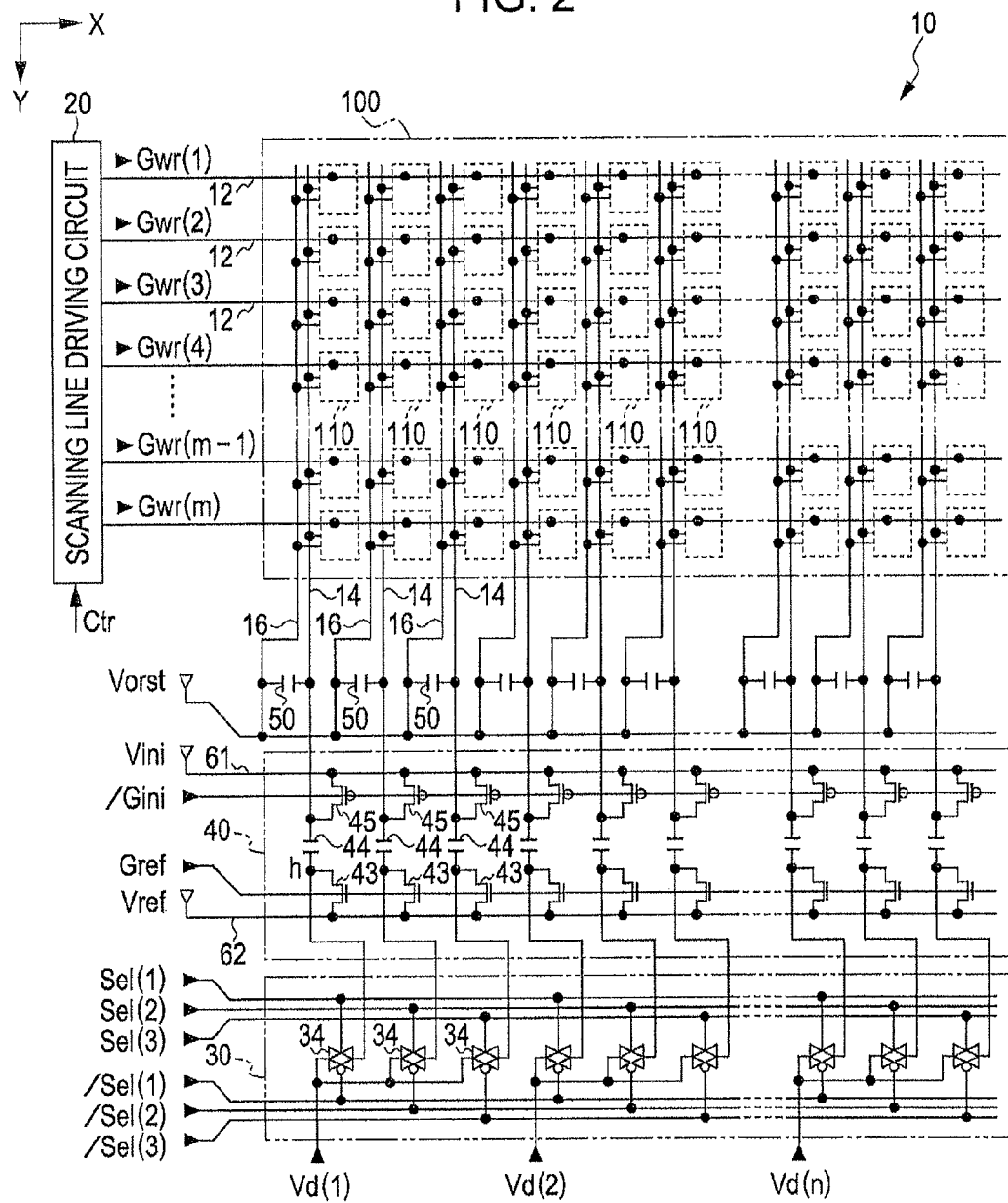
FIG. 2 is a view showing a configuration of the same electro-optical device.

FIG. 2 is a view showing a configuration of the electro-optical device 10 according to the first embodiment. As shown in the drawing, the electro-optical device 10 is divided broadly into a scanning line driving circuit 20, a demultiplexer 30, a level shift circuit 40, and a display unit 100.

Among these, in the display unit 100, pixel circuits 110 corresponding to the pixels of the image to be displayed are arranged in a matrix shape. In detail, as shown in FIG. 2, in the display unit 100, m rows of scanning lines 12 are provided to extend in the X direction (first direction), and, (3n) columns of data lines 14 grouped in threes are provided to extend in the Y direction (second direction) and preserve the electrical insulation between each of the scanning lines 12. Then, pixel circuits 110 corresponding to the intersection portions between the m rows of scanning lines 12 and the (3n) columns of data lines 14 are provided. For this reason, in the present embodiment, the pixel circuits 110 are arranged in a matrix shape with m rows vertically×(3n) columns horizontally.

Here, m and n are both natural numbers. In the matrix of the scanning lines 12 and the pixel circuit 110, in order to distinguish the rows, there are cases where the rows are referred to as 1, 2, 3, ..., (m-1), and m in order from the top of the drawing. In the same manner, in order to distinguish between the columns of the matrix of the data lines 14 and the pixel circuits 110, there are cases where the columns are referred to as 1, 2, 3, ..., (3n-1), and (3n) in order from the left of the drawing. In addition, when the integer j of 1 or more to n or less is used in order to generalize and explain the groups of the data lines 14, it signifies that the data lines 14 of the (3j-2) column, the (3j-1) column, and the (3j) column belong to the j-th group counted from the left.

Here, three pixel circuits 110 corresponding to the intersections of the scanning lines 12 of the same row and three columns of the data lines 14 belonging to the same group respectively correspond to pixels of R (red), G (green), and B (blue), and these three pixels express one dot of the color image to be displayed. That is, in the present embodiment, a color of one dot is configured to be expressed using additive color mixing according to the emitted light of the OLED corresponding to RGB.

In the present embodiment, in each column, potential lines 16 are respectively provided along the data lines 14. A potential Vorst as a reset potential is supplied in common to each potential line 16. In addition, a storage capacitor 50 is provided in each column. In detail, one end of the storage capacitor is connected to the data line 14 and the other end is connected to the potential line 16. For this reason, the storage capacitor 50 functions as a second storage capacitor holding the potential of the data line 14.

Here, it is preferable to adopt a configuration in which the storage capacitor 50 is formed by interposing an insulating body (dielectric body) with wiring configuring the data lines 14 and wiring configuring the potential lines 16.

In addition, the storage capacitor 50, is provided on the outside of the display unit 100 in FIG. 2; however, this is only an equivalent circuit, and it may be provided in the inside of the display unit 100 or passing from the inside to the outside thereof as a matter of course. Further, although omitted in FIG. 2, the capacitance of the storage capacitor 50 is set as Cdt.

Here, the following kind of control signal is supplied by the control circuit 5 to the electro-optical device 10. In detail, a control signal Ctr for controlling the scanning line driving circuit 20, control signals Sel(1), Sel(2), and Sel(3) for controlling the selection with the demultiplexer 30, control signals /Sel(1), /Sel(2), and /Sel(3) which had a logic inversion relationship with respect to these signals, a negative logic control signal /Gini for controlling the level shift circuit 40, and a positive logic control signal Gref are supplied to the electro-optical device 10. In addition, in practice, the control signal Ctr includes a plurality of signals such as a pulse signal or a clock signal, and an enable signal.

In addition, the data signals Vd(1), Vd(2), . . . , and Vd(n) matching the selection timing of the demultiplexer 30 are supplied to the electro-optical device 10 by the control circuit 5 corresponding to the groups numbered 1, 2, . . . , and n. Here, the maximum value of the potential that can be taken by the data signals Vd(1) to Vd(n) is set as Vmax and the minimum value is set as Vmin.

The scanning line driving circuit 20 generates scanning signals for scanning the scanning lines 12 in order one row at a time throughout the period of the frame in accordance with the control signal Ctr. Here, the scanning signals supplied to the scanning lines 12 of rows numbered 1, 2, 3, . . . , (m-1), and m are denoted as Gwr(1), Gwr(2), Gwr(3), . . . , Gwr(m-1), and Gwr(m).

Here, in addition to the scanning signals Gwr(1) to Gwr(m), the scanning line driving circuit 20 generates various types of control signals synchronized with the scanning signals for each row and performs supply thereof to the display unit 100; however, these are not drawn in FIG. 2. Further, the period of the frame refers to the period necessary for the electro-optical device 10 to display an image of 1 cut (frame) portion, for example, if the frequency of the orthogonal synchronization signal included in the synchronization signal is 120 Hz, the one cycle portion is a period of 8.3 milliseconds.

The demultiplexer 30 is a collection of transmission gates 34 provided for each column, and supplies data signals in order to the three columns configuring each group.

Here, the input ends of the transmission gates 34 corresponding to the columns (3j-2), (3j-1), and (3j) belonging to the j numbered groups are mutually connected in common and respective data signals Vd(j) are supplied to the common terminals.

The transmission gates 34 provided in columns (3j-2) which are the left end columns in the j numbered groups are turned on (conduct) when the control signal Sel(1) is the H level (control signal /Sel(1) is the L level). Similarly, the transmission gates 34 provided in columns (3j-1) which are the middle columns in the j numbered groups are turned on when the control signal Sel(2) is the H level (when the control signal /Sel(2) is the L level) and the transmission gates 34 provided in columns (3j) which are the right end columns in the j numbered groups are turned on when the control signal Sel(3) is the H level (when the control signal /Sel(3) is the L level).

The level shift circuit 40 has a set of the storage capacitor 44, the P channel MOS type transistor 45, and the N channel MOS type transistor 43 for each column, and shifts the potential of the data signals output from the output end of the transmission gate 34 of each column. Here, one end of the storage capacitor 44 is connected to a data line 14 of the corresponding column and the drain node of the transistor 45 while the other end of the storage capacitor 44 is connected to the output end of the transmission gate 34 and the drain node of the transistor 43. For this reason, the storage capacitor 44 functions as a third storage capacitor of which one end is connected to the data lines 14 and data signals are supplied to the other end. Although omitted from FIG. 2, the capacitance of the storage capacitor 44 is set to Crf1.

The source nodes of the transistors 45 of each column are connected in common across each column to a power supply line 61 supplying the potential Vini as the initial potential, and the control signal /Gini is supplied in common across each column to the gate nodes. For this reason, the transistor 45 is configured so as to electrically connect the data lines 14 and the power supply lines 61 when the control signal /Gini is the L level and to perform electrical disconnection when the control signal /Gini is the H level.

In addition, the source nodes of the transistors 43 of each column are connected in common across each column to the power supply line 62 supplying the potential Vref as a predetermined potential, and the control signal Gref is supplied in common across each column to the gate nodes. For this reason, the transistor 43 is configured so as to electrically connect the node h which is the other end of the storage capacitor 44 and the power supply lines 62 when the control signal Gref is the H level and to perform electrical disconnection when the control signal Gref is the L level.

In the present embodiment, although divided into the scanning line driving circuit 20, the demultiplexer 30 and the level shift circuit 40 for convenience, these may be conceived together as driving circuits driving the pixel circuits 110.

Description will be given of the pixel circuits 110 with reference to FIG. 3. Since each pixel circuit 110 has the same configuration as the others electrically, here, description will be given taking the pixel circuit 110 of the i row (3j-2) column positioned at the (3j-2)-th column of the left end side in the groups numbered j, which is an i-th row, as an example. In addition, i is a reference sign of a case generally showing rows in which the pixel circuits 110 are arranged, and is an integer of 1 or more and m or less.

Figure 3:
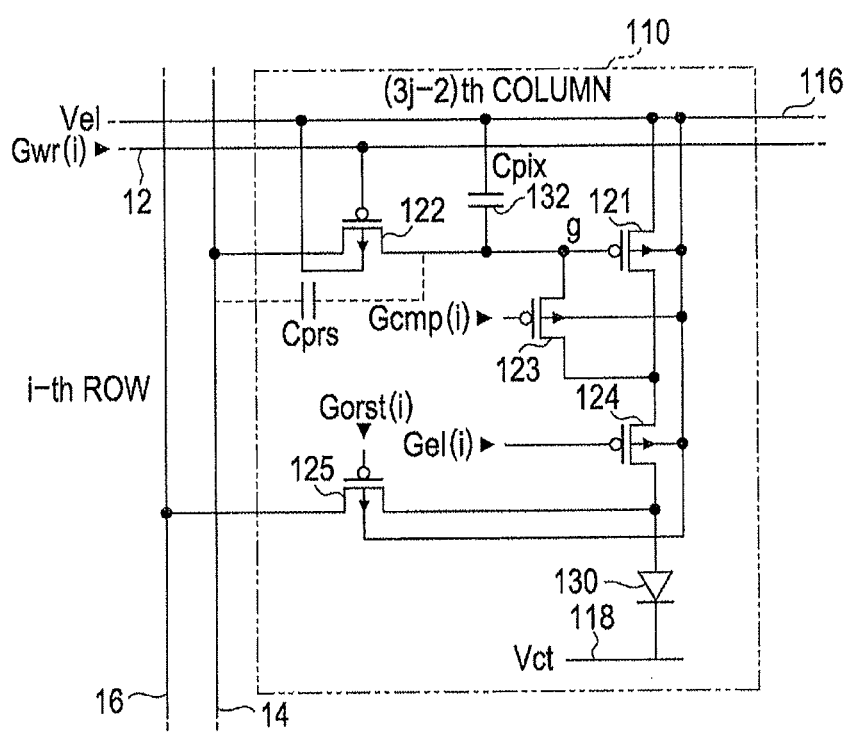
FIG. 3 is a view showing a pixel circuit in the same electro-optical device.

As shown in FIG. 3, the pixel circuit 110 includes P channel MOS type transistors 121 to 125, an OLED 130, and a storage capacitor 132. The scanning signal Gwr(i), the control signals Gel(i), Gcmp(i), and Gorst(i) are supplied to the pixel circuits 110. Here, the scanning signal Gwr(i), and the control signals Gel(i), Gcmp(i), and Gorst(i) are supplied by the scanning line driving circuit 20 corresponding to the respective i rows. For this reason, the scanning signal Gwr(i), and the control signals Gel(i), Gcmp(i), and Gorst(i) are also supplied in common to pixel circuits of columns other than the (3j-2) column being focused on if in the i row.

In the transistor 122, the gate node is connected to the scanning lines 12 of the i row, and one of the drain or the source node is respectively connected to the gate node g in the transistor 121, one end of the storage capacitor 132, and one of the source or the drain of the transistor 123. In addition, in the transistor 122, the other of the drain or the source node is connected to the data lines 14 of the (3j-2) column. That is, the transistor 122 is electrically connected between the gate node g of the transistor 121 and the data lines 14, controls the electrical connection between the gate node g of the transistor 121 and the data lines 14, and functions as a writing transistor. Here, the gate node of transistor 121 is denoted as g in order to be distinguished from other nodes.

In the transistor 121, the source node is connected to the power supply line 116, and the drain node is respectively connected to the other of the source or the drain node of the transistor 123 and the source node of the transistor 124. Here, the potential Vel which is the high order side of the power in the pixel circuit 110 is supplied to the power supply line 116. The transistor 121 functions as a driving transistor driving current according to the voltage between the gate node and the source node of the transistor 121.

The control signal Gcmp(i) is supplied to the gate node of the transistor 123. The transistor 123 controls the electrical connection between the source node and the gate node g of the transistor 121 and functions as a threshold compensation transistor.

The control signal Gel(i) is supplied to the gate node of the transistor 124 and the drain node is respectively connected to the source node of the transistor 125 and the anode of the OLED 130. In other words, the transistor 124 controls the electrical connection between the drain node of the transistor 121 and the anode of the OLED 130 and functions as a light-emitting control transistor.

The control signal Gorst(i) corresponding to the i row is supplied to the gate node of the transistor 125, and the drain node is connected to the potential line 16 of (3j-2) column and preserved at the potential Vorst. The transistor 125 functions as an initialization transistor controlling the electrical connection between the potential line 16 and the anode of the OLED 130.

The other end of the storage capacitor 132 is connected to the power supply line 116. For this reason, the storage capacitor 132 functions as a first storage capacitor holding the voltage between the gate and the source of the transistor 121. In the following, the capacitance of the storage capacitor 132 is denoted as Cpix.

The capacitance Cdt of the storage capacitor 50, the capacitance Crf1 of the storage capacitor 44, and the capacitance Cpix of the storage capacitor 132 are set so that $$Cdt > Crf1 \gg Cpix$$

That is, Cdt is set to be greater than Crf1, and Cpix is set to be sufficiently smaller than Cdt and Crf1.

Here, although details will be given below, the storage capacitor 132 in the present embodiment is formed by interposing an insulating layer with mutually different wiring layers; however, a parasitic capacitance on the gate node g of the transistor 121 may be used as the storage capacitor 132.

Since the electro-optical device 10 in the present embodiment is formed on a silicon substrate, the substrate potential of the transistors 121 to 125 is set to the potential Vel.

The anode of the OLED 130 is a pixel electrode provided individually for each pixel circuit 110. In contrast, the cathode of the OLED 130 is a common electrode 118 common across all of the pixel circuits 110, and preserved at the potential Vct which is the low order side of the power in the pixel circuits 110.

In the above-described silicon substrate, the OLED 130 is an element in which a white organic EL layer is interposed by an anode and a cathode having light permeability. Here, on the output side (cathode side) of the OLED 130, a color filter corresponding to any one of RGB is superimposed.

In such an OLED 130, when the current flows from the anode to the cathode, the holes injected from the anode and the electrons injected from the cathode are recombined in the organic EL layer, excitons are produced, and white light is generated. The white light generated at this time passes through a cathode of the opposite side to the silicon substrate (anode), is colored by the color filter, and configured to be visible on the observation side.

Figure 4:
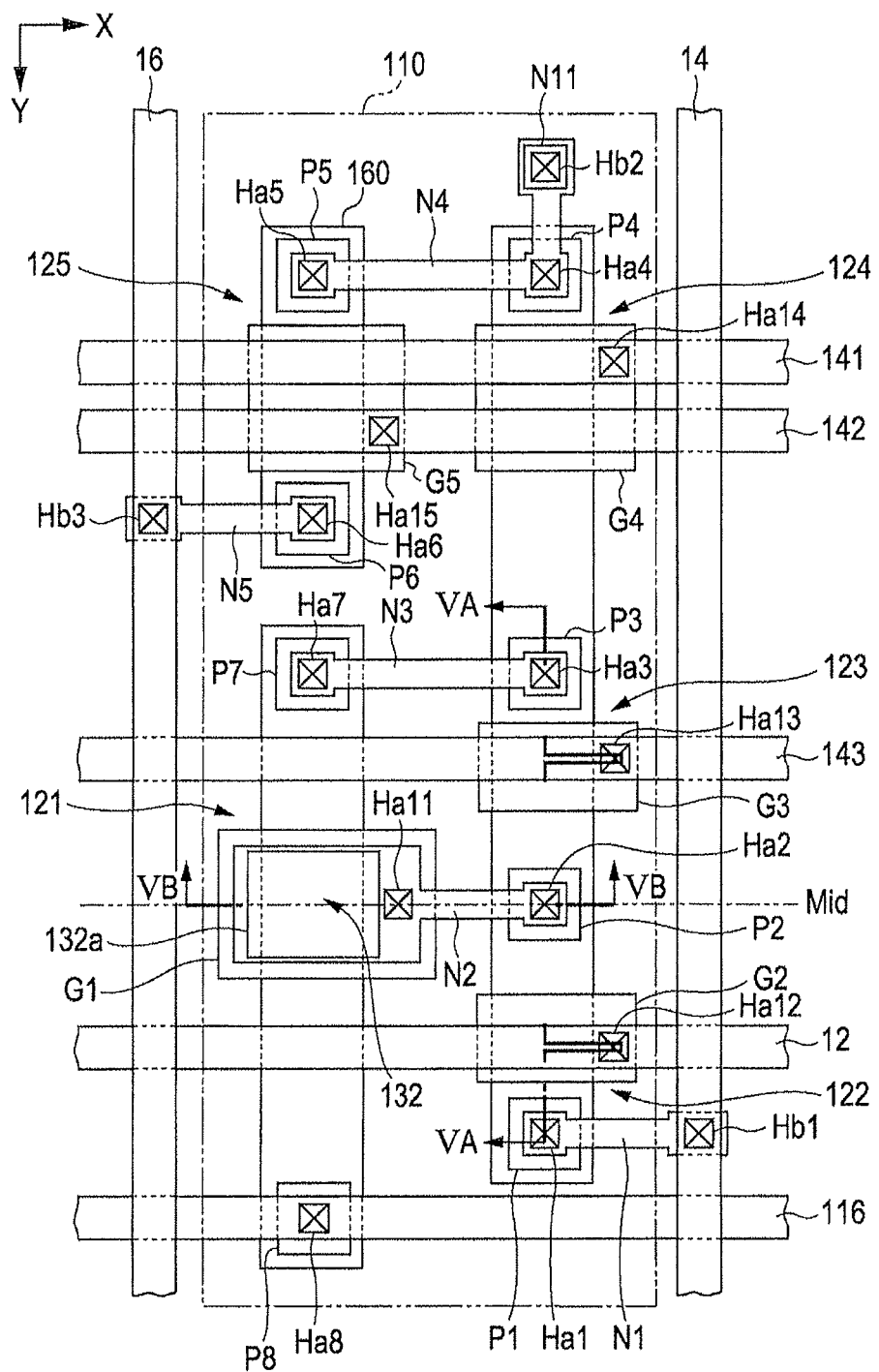
FIG. 4 is a plan view showing a structure of the same electro-optical device.

Description will be given of the structure of the pixel circuits 110 with reference to FIG. 4 and FIGS. 5A and 5B. Since each pixel circuit 110 is configured in the same manner, in FIG. 4 and FIGS. 5A and 5B, description is given taking the pixel circuit 110 of i row (3j-2) column as an example. FIG. 4 is a plan view showing a configuration of the pixel circuit 110 of i row (3j-2) column. In addition, FIG. 5A is a partial cross-sectional view cut away along line VA-VA in FIG. 4, and FIG. 5B is a partial cross-sectional view cut away along line VB-VB in FIG. 4.

In addition, FIG. 4 shows the wiring structure of a case where the pixel circuit 110 of the transmission structure is a plan view from the observation side; however, for simplicity, the structural body formed after the second wiring layer to be described later has been omitted. Similarly, in FIGS. 5A and 5B, for simplicity, the structural body formed after the third interlayer insulating layer L3 to be described later has been omitted.

Here, in each of the above drawings, there are cases where the scales are made to be different in order to set each layer, each member, each region, and the like to a visible size.

Figure 5A:
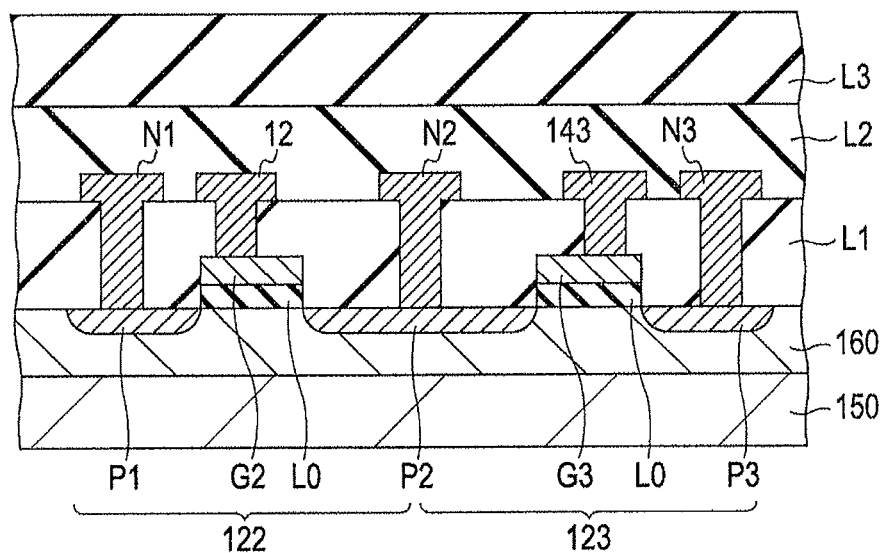
FIGS. 5A and 5B are partial cross-sectional views showing the structure of the same electro-optical device.
Figure 5B:
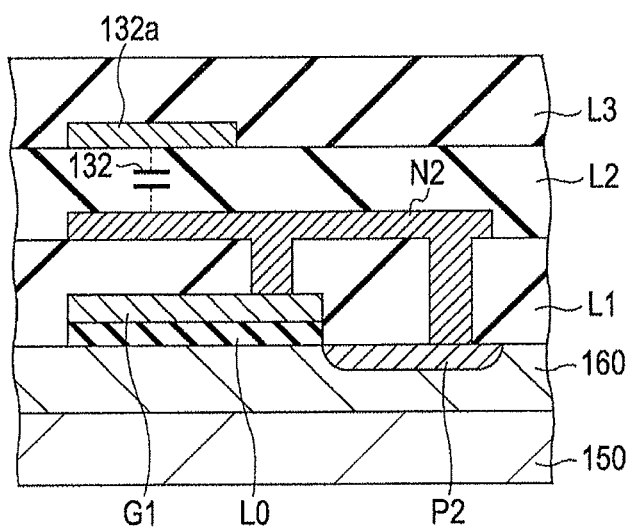

As shown in FIGS. 5A and 5B, each element configuring the pixel circuit 110 is formed on a silicon substrate 150. In the present embodiment, a P type semiconductor substrate is used as the silicon substrate 150.

On the silicon substrate 150, N wells 160 are formed across almost the entire surface. Here, in FIG. 4, when shown in plan view, in order to enable the regions where the transistors 121 to 125 are provided to be easily grasped, only the regions where the transistors 121 to 125 are provided and the vicinity thereof in the N wells 160 are shown with hatching.

A potential Vel is supplied to the N wells 160 through an N type diffusion layer (not shown). For this reason, the substrate potential of the transistors 121 to 125 is the potential Vel.

As shown in FIG. 4 and FIGS. 5A and 5B, by doping ions in the surface of the N wells 160, a plurality of P type diffusion layers are formed. Specifically, on the surface of the N wells 160, 8 P type diffusion layers P1 to P8 are formed for each pixel circuit 110.

These P type diffusion layers P1 to P8 function as sources or drains of the transistors 121 to 125.

As shown in FIGS. 5A and 5B, on the surfaces of the N wells 160 and the P type diffusion layers P1 to P8, a gate insulating layer L0 and gate electrodes G1 to G5 are formed by patterning.

These gate electrodes G1 to G5 function as gates of each of the transistors 121 to 125.

As shown in FIG. 4 and FIGS. 5A and 5B, the transistor 121 is configured to have a gate electrode G1, a P type diffusion layer P7 and a P type diffusion layer P8. Among these, the P type diffusion layer P8 functions as a source of the transistor 121, and the P type diffusion layer P7 functions as a drain of the transistor 121.

In addition, the transistor 122 is configured to have a gate electrode G2, a P type diffusion layer P1 and a P type diffusion layer P2. Among these, the P type diffusion layer P2 functions as one of a source or a drain of the transistor 122, and the P type diffusion layer P1 functions as the other of the source or the drain of the transistor 122.

The transistor 123 is configured to have a gate electrode G3, a P type diffusion layer P2 and a P type diffusion layer P3. Among these, the P type diffusion layer P2 functions as one of a source or a drain of the transistor 123 and the P type diffusion layer P3 functions as the other of the source or the drain of the transistor 123.

That is, the P type diffusion layer P2 is a common diffusion layer which functions as one of the source or the drain of the transistor 122, and functions as one of the source or the drain of the transistor 123.

The transistor 124 is configured to have a gate electrode G4, a P type diffusion layer P3 and a P type diffusion layer P4. Among these, the P type diffusion layer P3 functions as a source of the transistor 124, and the P type diffusion layer P4 functions as a drain of the transistor 124.

The transistor 125 is configured to have a gate electrode G5, a P type diffusion layer P5 and a P type diffusion layer P6. Among these, the P type diffusion layer P5 functions as a source of the transistor 125, and the P type diffusion layer P6 functions as a drain of the transistor 125.

As shown in FIGS. 5A and 5B, a first interlayer insulating layer L1 is formed so as to cover the gate electrodes G1 to G5 and the gate insulating layer L0.

By patterning a wiring layer with conductivity of aluminum or the like on the surface of the first interlayer insulating layer L1, scanning lines 12, power supply lines 116, and signal lines 141 to 143 are respectively formed and relay nodes N1 to N5 are respectively formed for each pixel circuit 110. Here, there are cases where these wiring layers formed on the surface of the first interlayer insulating layer L1 are collectively referred to as first wiring layers.

As shown in FIG. 4 and FIGS. 5A and 5B, the relay node N1 is connected to the P type diffusion layer P1 through a contact hole Ha1 passing through the first interlayer insulating layer L1. In other words, the relay node N1 is equivalent to the other of the source node or the drain node of the transistor 122. Here, in FIG. 4, the contact holes are shown as portions having a square mark with a cross inside at portions where different types of wiring layers are overlapped.

The relay node N2 is connected to the P type diffusion layer P2 through the contact hole Ha2 and connected to the gate electrode G1 through the contact hole Ha11. In other words, the relay node N2 is equivalent to the gate node g of the transistor 121, and equivalent to one of the source node or the drain node of the transistor 122 and one of the source or drain node of the transistor 123. Here, the wiring formed of the contact hole Ha2, the relay node N2, and the contact hole Ha11 functions as connection wiring electrically connecting the P type diffusion layer P2 and the gate node G1.

The relay node N3 is connected to the P type diffusion layer P3 through the contact hole Ha3 and connected to the P type diffusion layer P7 through the contact hole Ha7. In other words, the relay node N3 is equivalent to the drain node of the transistor 121, and equivalent to the other of the source or the drain node of the transistor 123 and the source node of the transistor 124.

The relay node N4 is connected to the P type diffusion layer P4 through the contact hole Ha4 and connected to the P type diffusion layer P5 through the contact hole Ha5. In other words, the relay node N4 is equivalent to the drain node of the transistor 124, and equivalent to the source node of the transistor 125.

The relay node N5 is connected to the P type diffusion layer P6 through the contact hole Ha6. In other words, the relay node N5 is equivalent to the drain node of the transistor 125.

The signal line 143 is connected to the gate electrode G3 through a contact hole Ha13. Here, a control signal Gcmp(i) corresponding to the pixel circuit 110 is supplied to the signal line 143. That is, the signal line 143 functions as a first signal line electrically connected to the gate of the transistor 123.

In addition, the signal line 141 is connected to the gate electrode G4 through a contact hole Ha14. A control signal Gel(i) corresponding to the pixel circuit 110 is supplied to the signal line 141.

The signal line 142 is connected to the gate electrode G5 through a contact hole Ha15. A control signal Gorst(i) corresponding to the pixel circuit 110 is supplied to the signal line 142.

The scanning line 12 is connected to the gate electrode G2 through a contact hole Ha12. The power supply line 116 is connected to the P type diffusion layer P8 through a contact hole Ha8.

Here, the contact holes Ha2 to Ha8 and the contact holes Ha11 to Ha15 are contact holes passing through the first interlayer insulating layer L1.

As shown in FIG. 4, when shown in plan view, the P type diffusion layer P2, the gate node G1, and the connection wiring are provided between the signal lines 143 and the scanning lines 12 at positions which do not overlap with the signal lines 143 or the scanning lines 12.

Here, in FIG. 4, a straight line which is an equal distance from the signal lines 143 and the scanning lines 12 is referred to as center line Mid. When shown in plan view, the P type diffusion layer P2, the gate node G1, and the connection wiring are provided at positions intersecting with the center line Mid. In more detail, when seen in plan view, the contact hole Ha2, the relay node N2, and the contact hole Ha11 configuring the connection wiring are all provided at positions intersecting with the center line Mid.

In this manner, by providing the P type diffusion layer P2, the gate node G1, and the connection wiring at positions so as to intersect with the center line Mid, the gap between the P type diffusion layer P2, the gate node G1, and the connection wiring, and the scanning lines 12 and the signal lines 143 is increased, whereby a parasitic capacitance on the capacitance therebetween (in particular, between the relay node N2 and the scanning lines 12 and between the relay node N2 and the signal lines 143, formed from the same layer) can be prevented.

In this manner, the influence of potential fluctuations generated at the scanning lines 12 and the signal lines 143 on the potential of the gate node g can be reduced, and the transistor 121 can accurately supply current according to the gradation level with respect to the OLED 130.

In the present embodiment, as shown in FIG. 4, the central portion of the vertical direction of the P type diffusion layer P2, the central portion of the vertical direction of the gate node G1, and the central portion of the vertical direction of the connection wiring are arranged so as to overlap with the center line Mid. That is, when the minimum value of the gap between the P type diffusion layer P2, the gate node G1, and the connection wiring, and the signal lines 143 is set to the first gap $\Delta y_1$, and the minimum value of the gap between the P type diffusion layer P2, the gate node G1, and the connection wiring, and the scanning lines 12 is set to the second gap $\Delta y_2$, the P type diffusion layer P2, the gate node G1, and the connection wiring are arranged so that the first gap $\Delta y_1$ and the second gap $\Delta y_2$ become equal.

As shown in FIGS. 5A and 5B, the second interlayer insulating layer L2 is formed so as to cover the first wiring layer and the first interlayer insulating layer L1.

By patterning a conductive wiring layer of aluminum or the like on the surface of the second interlayer insulating layer L2, the data lines 14 and the potential lines 16 are respectively formed and, for each pixel circuit 110, the relay node N11 and the electrode 132a are respectively formed. Although omitted from the drawings, the electrode 132a and the power supply line 116 are electrically connected and a potential Vel is supplied to the electrode 132a. Here, by interposing the second interlayer insulating layer L2 between the electrode 132a and the gate electrode G1, the storage capacitor 132 is formed.

In addition, there are cases where the wiring layers formed at the surface of the second interlayer insulating layer L2 are collectively referred to as the second wiring layer.

Here, in the PN bond between the P type diffusion layer and the N wells 160, the potential of the P type diffusion layer is set to a state (reverse bias state) lower than the potential of the N wells 160.

However, although the charge accumulated by the storage capacitor 132 is slight, there is a leak to the N wells 160 through the connection wiring and the P type diffusion layer P2. In a case where the transfer of this charge, that is, the leakage current is large, the storage capacitor 132 becomes unable to maintain the voltage between the gate and source of the transistor 121. Therefore, in order for the transistor 121 to supply an accurate current according to the gradation level to the OLED 130, it is necessary to make the leakage current as small as possible.

The size of the leakage current becomes larger according to the contact area of the P type diffusion layer and the N wells 160. Thus, in the pixel circuit 110 according to the present embodiment, one of the source or the drain of the transistor 122 and one of the source or the drain of the transistor 123 are formed by a common diffusion layer (P type diffusion layer P2). In this manner, the pixel circuit 110 according to the present embodiment can reduce the leakage current in comparison with a pixel circuit in which the transistor 122 and the transistor 123 are formed by separate diffusion layers. That is, the pixel circuit 110 according to the present embodiment can keep the deterioration of the display quality caused by the leakage current to a minimum.

As shown in FIG. 4, the relay node N11 is connected to the relay node N4 through the contact hole Hb2.

The data lines 14 are connected to the relay node N1 through the contact hole Hb1. For this reason, the data lines 14 are connected to the P type diffusion layer P1 through the relay node N1 (that is, the other of the source or the drain of the transistor 122).

The potential line 16 is connected to the relay node N5 through the contact hole Hb3. For this reason, the potential line 16 is connected to the P type diffusion layer P6 (that is, the drain of the transistor 125) through the relay node N5.

In addition, the contact holes Hb1 to Hb3 are contact holes passing though the second interlayer insulating layer L2.

As shown in FIGS. 5A and 5B, the third interlayer insulating layer L3 is formed so as to cover the second wiring layer and the second interlayer insulating layer L2.

In the electro-optical device 10, the structure after the third interlayer insulating layer L3 has been omitted from the drawings; however, anodes of the OLED 130 are formed on the third interlayer insulating layer L3 by patterning a wiring layer having conductivity of aluminum, ITO (Indium Tin Oxide), or the like. The anodes of the OLED 130 are individual pixel electrodes for each pixel circuit 110, and are connected to the relay node N11 through contact holes passing through the third interlayer insulating layer L3. That is, the anodes of the OLED 130 are connected to the P type diffusion layer P4 (in other words, the drain of the transistor 124) and the P type diffusion layer P5 (in other words, the source of the transistor 125) through the relay node N11 and the relay node N4.

In addition, although omitted from the drawings, on the anodes of OLED 130, a light-emitting layer formed of an organic EL material divided for each pixel circuit 110 is laminated. Here, a cathode (common electrode 118) which is a common transparent electrode is provided across all of the plurality of pixel circuits 110 on the light-emitting layer.

That is, the OLED 130 interposes the light-emitting layer between the anode and the cathode opposite to each other, and emits light with a luminance according to the current flowing toward the common electrode 118 from the anode. In the light emitted from the OLED 130, the light in the direction opposite (that is, the upward direction in FIGS. 5A and 5B) to the silicon substrate 150 is visible to an observer as an image (top emission structure).

In addition to this, a sealing material or the like for sealing the light-emitting layer from the atmosphere is provided; however, description thereof is omitted.

Operation of the First Embodiment

Figure 6:
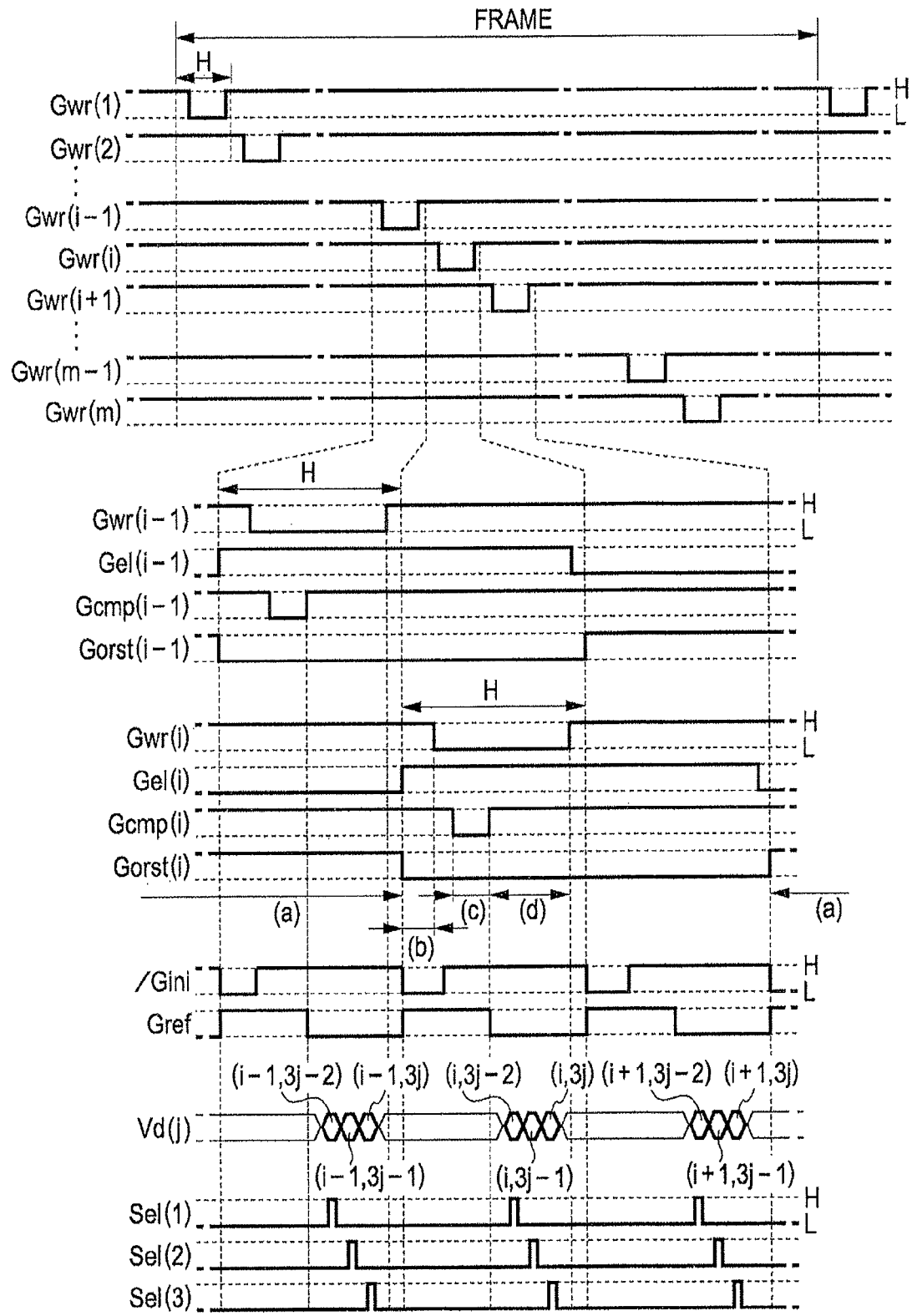
FIG. 6 is a timing chart showing operations of the same electro-optical device.

Description will be given of the operation of the electro-optical device 10 with reference to FIG. 6. FIG. 6 is a timing chart for illustrating operations of each portion in the electro-optical device 10.

As shown in the drawing, the scanning signals Gwr(1) to Gwr(m) are sequentially switched to the L level and, in the period of one frame, 1 to m rows of scanning lines 12 are scanned in order for each single horizontal scanning period (H).

The operation in the single horizontal scanning period (H) is common across the pixel circuits 110 of each row. In the following, description will be given of the operation in a scanning period in which an i-th row is horizontally scanned with particular focus on the pixel circuit 110 of the i row (3j-2) column.

In the present embodiment, when classifying the scanning periods of the i-th row, in FIG. 6, the periods are divided into an initialization period shown by (b), a compensation period shown by (c), and a writing period shown by (d). Here, after the writing period of (d), after a pause, a light-emitting period shown by (a) is started, and the scanning period of the i-th row is reached again after the passing of the period of one frame. For this reason, regarding the chronological order, a cycle of (light-emitting period)->initialization period->compensation period->writing period->(light-emitting period) is repeated.

Here, in FIG. 6, each of the scanning signal Gwr(i-1), the control signals Gel(i-1), Gcmp(i-1) and Gorst(i-1) corresponding to the (i-1)-th row one row before the i row forms a waveform which is earlier than each of the scanning signal Gwr(i), and the control signals Gel(i), Gcmp(i) and Gorst(i) corresponding to the i row by a single horizontal scanning period (H) only.

Light-Emitting Period

For convenience of explanation, description will be given from the light-emitting period which is a prerequisite for the initialization period. As shown in FIG. 6, in the light-emitting period of the i-th row, the scanning signal Gwr(i) is the H level and the control signal Gel(i) is the L level. In addition, among the control signals Gel(i), Gcmp(i), and Gorst(i) which are logic signals, the control signal Gel(i) is the L level, and the control signals Gcmp(i) and Gorst(i) are the H level.

Figure 7:
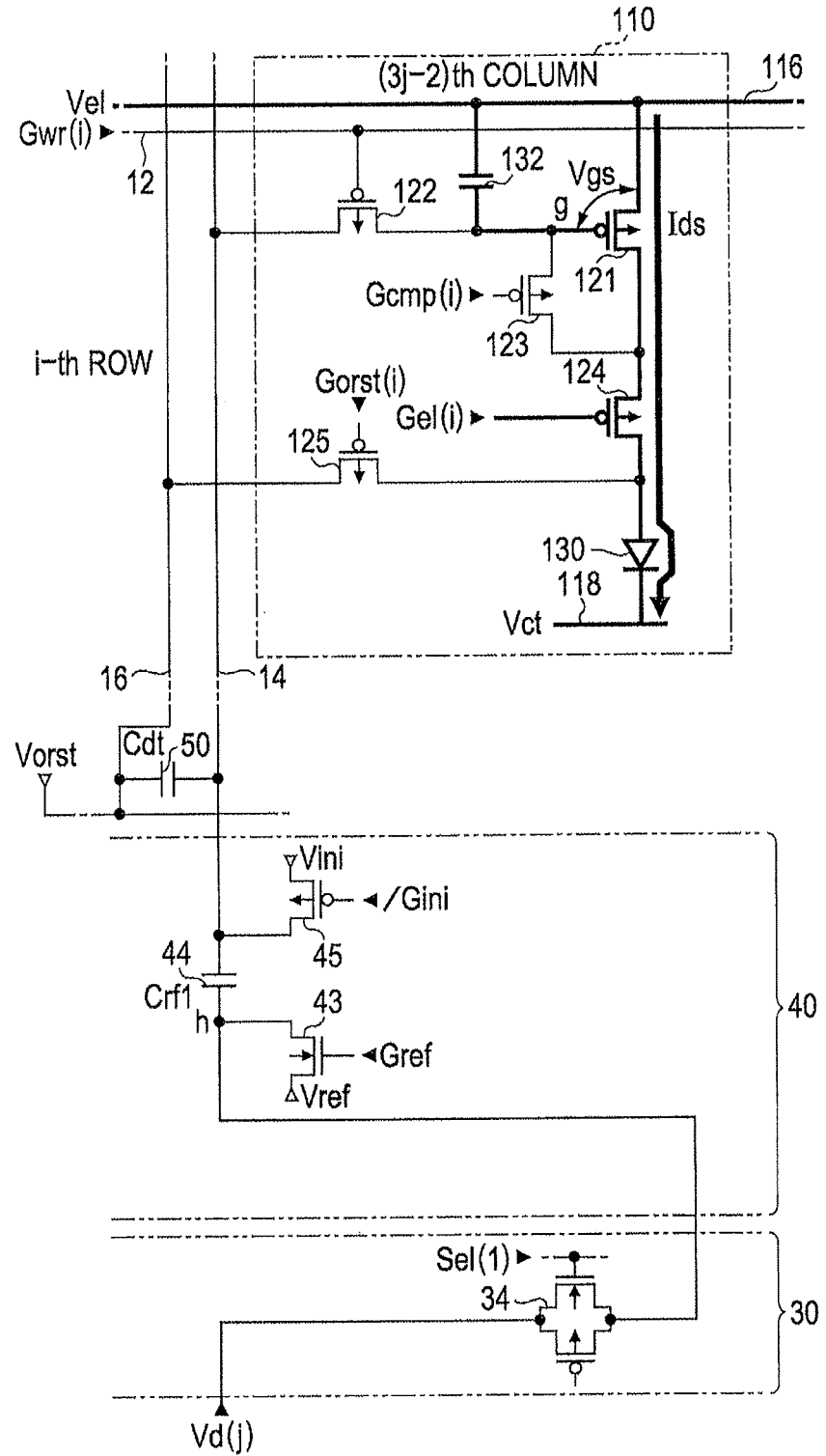
FIG. 7 is an explanatory diagram of operations of the same electro-optical device.

For this reason, in the pixel circuits 110 of the i row (3j-2) column as shown in FIG. 7, the transistor 124 is turned on while the transistors 122, 123, and 125 are turned off. Therefore, the transistor 121 supplies a current Ids according to the voltage Vgs between the gate and the source to the OLED 130. As will be described later, the Vgs voltage in the light-emitting period in the present embodiment is a value level-shifted according to the potential of the data signals from the threshold voltage of the transistor 121. For this reason, in the OLED 130, the current according to the gradation level is supplied in a state where the threshold voltage of the transistor 121 is compensated.

In addition, since the light-emitting period of the i-th row is a period in which horizontal scanning of other than the i row is performed, the potential of the data lines 14 is appropriately changed. However, in the pixel circuit 110 of the i-th row, since the transistor 122 is turned off, here, potential changes of the data lines 14 are not considered.

In addition, in FIG. 7, the path which is important in the description of the operation is shown with a bold line (the same applies in FIGS. 8 to 10, and FIGS. 17 to 20 below).

Initialization Period

Next, when the scanning period of the i-th row is reached, first, the initialization period of (b) is started as the first period. In the initialization period, in comparison with the light-emitting period, the control signal Gel(i) is changed to the H level and the control signal Gorst(i) is changed to the L level, respectively.

Figure 8:
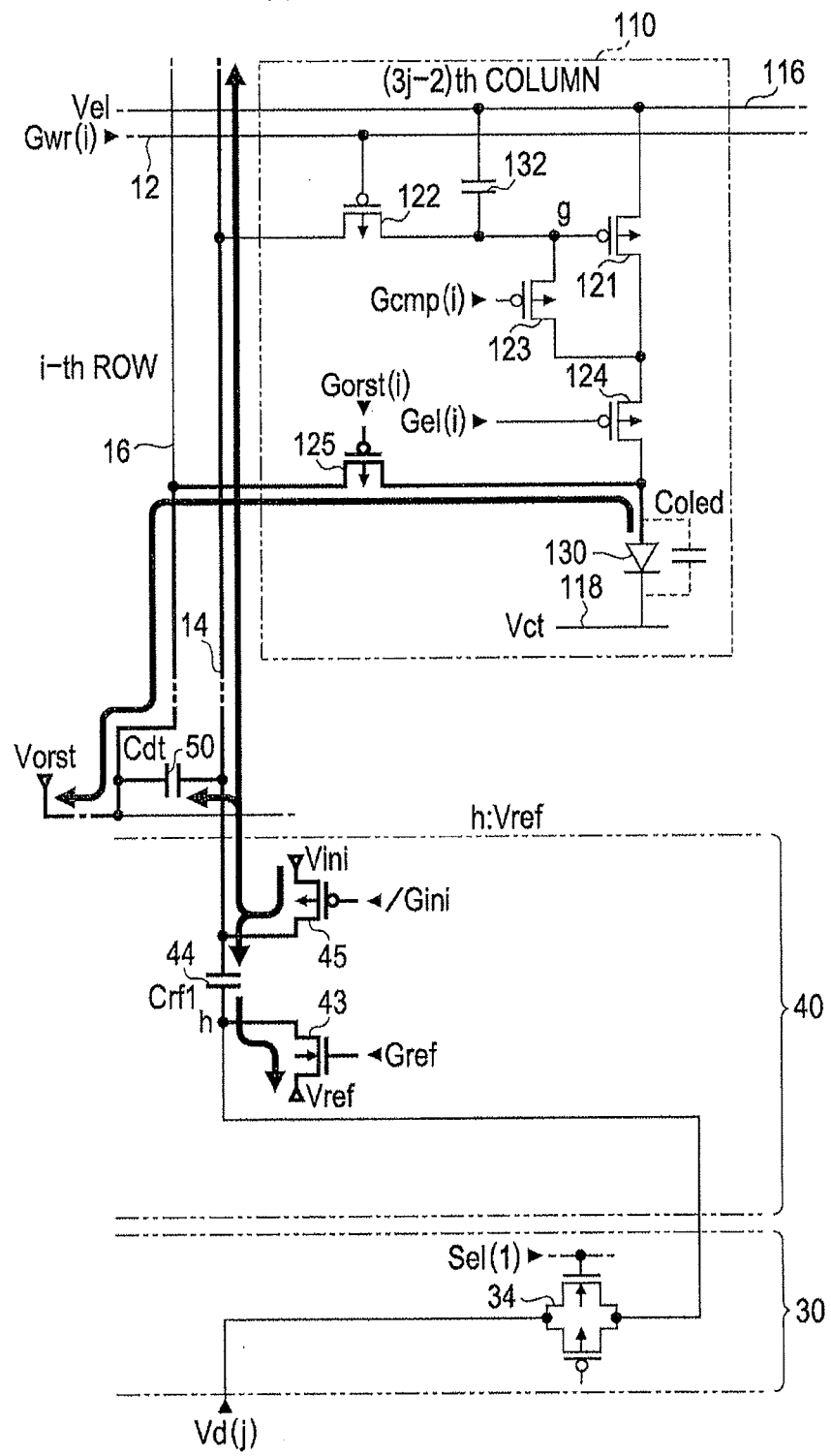
FIG. 8 is an explanatory diagram of operations of the same electro-optical device.

For this reason, as shown in FIG. 8, in the pixel circuit 110 of the i row (3j-2) column, the transistor 124 is turned off and the transistor 125 is turned on. In this manner, the path of the current supplied to the OLED 130 is interrupted and the anodes of the OLED 130 are reset to the potential Vorst.

Since the OLED 130 has a configuration in which the organic EL layer is interposed by the anode and the cathode as described above, as shown by a broken line in the drawing, a capacitor Coled has a parasitic capacitance in parallel between the anode and the cathode. When the current was flowing in OLED 130 in the light-emitting period, the voltages of both ends between the anode and the cathode of the OLED 130 are held by the capacitor Coled; however, the held voltage is reset by turning on the transistor 125. For this reason, in the present embodiment, when the current flows again to the OLED 130 in the subsequent light-emitting period, it is not easily affected by the influence of the voltage held by the capacitor Coled.

In detail, for example, when a high luminance display state is changed to a low luminance display state, if the configuration is one which is not reset, since a high voltage of the time when the luminance was high (a large current was flowing) is held, next, an excessive current is made to flow when trying to make a small current flow and it becomes impossible to obtain the low luminance display state. In contrast, in the present embodiment, since the potential of the anode of the OLED 130 is reset by turning the transistor 125 on, the reproducibility of the low luminance side can be improved.

In this embodiment, regarding the potential Vorst, the difference between the potential Vorst and the potential Vct of the common electrode 118 is set so as to fall below the light-emitting threshold voltage of the OLED 130. For this reason, in the initialization period (the compensation period and writing period described next), the OLED 130 is in an off (non-light-emitting) state.

On the other hand, in the initialization period, since the control signal /Gini is the L level and the Control signal Gref is the H level, the transistors 45 and 43 as shown in FIG. 8 are respectively turned on in the level shift circuit 40. For this reason, the data line 14 which is one end of the storage capacitor 44 is initialized to the potential Vini and the node h which is the other end of the storage capacitor 44 is initialized to the potential Vref, respectively.

Regarding the potential Vini in the present embodiment, (Vel−Vini) is set to be larger than the threshold voltage |Vth| of the transistor 121. In addition, since the transistor 121 is a P channel type, the threshold voltage Vth based on the potential of the source node is negative. Here, in order to prevent confusion in the description of the relationship between high and low, the threshold voltage is set to be expressed by the absolute value |Vth| and regulated by magnitude correlation.

In addition, with respect to the potential which can be taken by the data signals Vd(1) to Vd(n), the potential Vref in the present embodiment is set to a value such that the potential of the node h in the subsequent writing period is increased, for example, set to be lower than the minimum value Vmin.

Compensation Period

In the scanning period of the i-th row, next, the compensation period of (c) is the second period. In the compensation period, in comparison with the initialization period, the scanning signal Gwr(i) and the control signal Gcmp(i) are the L level. Meanwhile, in the compensation period, the control signal /Gini is the H level in a state where the control signal Gref is maintained at the H level.

Figure 9:
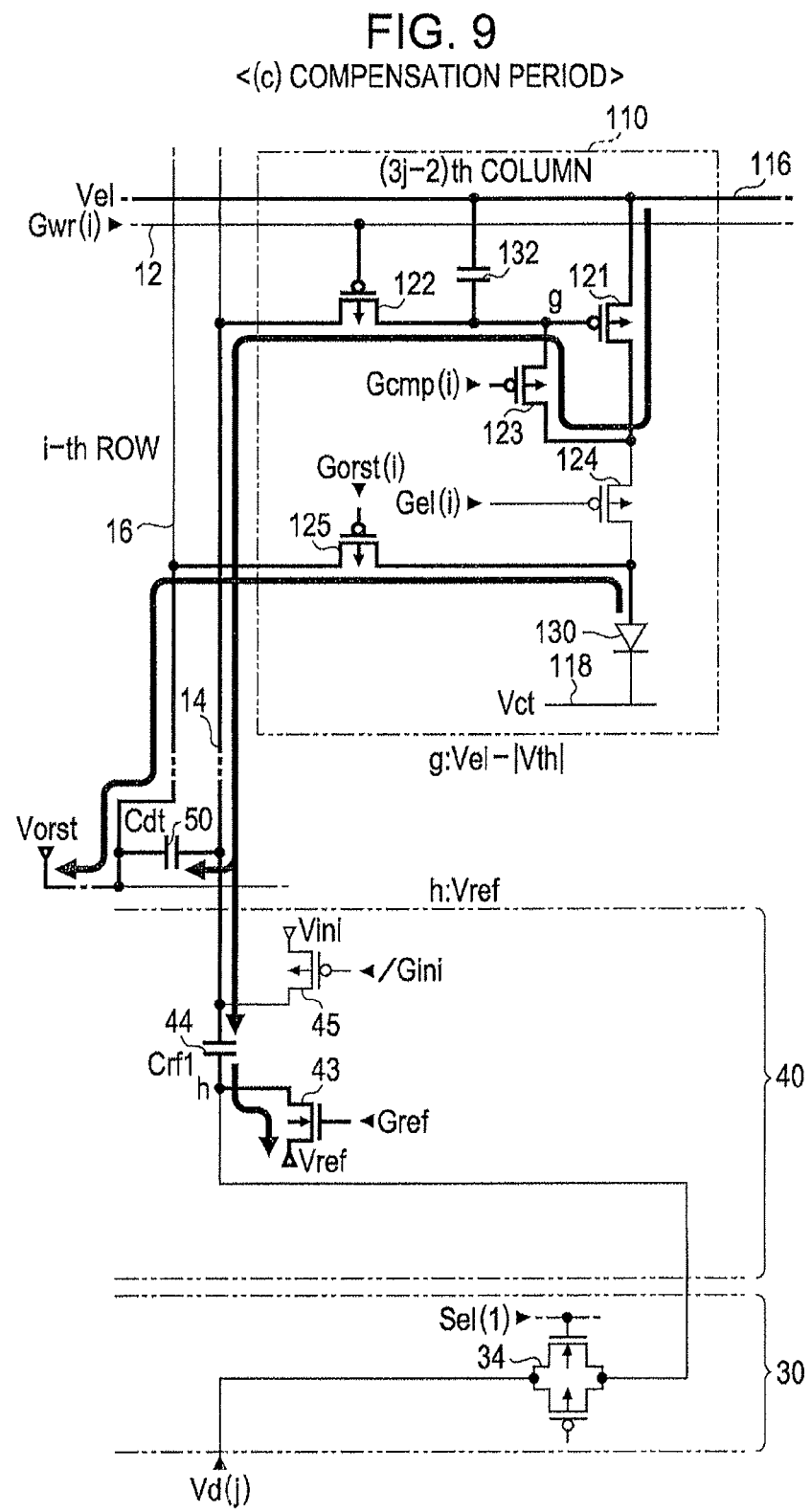
FIG. 9 is an explanatory diagram of operations of the same electro-optical device.

For this reason, as shown in FIG. 9, in the level shift circuit 40, the node h is fixed at the potential Vref by turning off the transistor 45 in a state where the transistor 43 is turned on. Meanwhile, since the gate node g is electrically connected to the data lines 14 by turning on the transistor 122 in the pixel circuit 110 of the i row (3j-2) column, the gate node g becomes the potential Vini at the start of the compensation period.

Since the transistor 123 is turned on in the compensation period, the transistor 121 becomes a diode connection. For this reason, the drain current flows in the transistor 121 and charges the gate node g and the data lines 14. In detail, the current flows in a path of the power supply line 116->the transistor 121->transistor 123->the transistor 122->the data line 14 of the (3j-2)-th column. For this reason, the data lines 14 and the gate node g which are in a mutually connected state due to the turning on of the transistor 121 are increased from the potential Vini.

However, since the current flowing in the above path flows less easily as the gate node g approaches the potential (Vel−|Vth|), the data line 14 and the gate node g are saturated by the potential (Vel−|Vth|) until the end of the compensation period is reached. Accordingly, the storage capacitor 132 holds the threshold voltage |Vth| of the transistor 121 until the end of the compensation period is reached.

Writing Period

After the initialization period, the writing period of (d) as the third period is reached. In the writing period, since the control signal Gcmp(i) becomes the H level, the diode connection of the transistor 121 is canceled, while since the control signal Gref becomes the L level, the transistor 43 is turned off. For this reason, the path from the data line 14 of the (3j-2) column to the gate node g in the pixel circuit 110 of the i row (3j-2) column is in a floating state, but the potential in the path is maintained at (Vel−|Vth|) by the storage capacitors 50 and 132.

For a j numbered group, the control circuit 5 in the writing period of the i row switches the data signals Vd(j) in order to a potential according to the gradation level of pixels of the i row (3j-2) column, the i row (3j-1) column, and the i row (3j) column. Meanwhile, the control circuit 5 sets the control signals Sel(1), Sel(2), and Sel(3) in order exclusively to the H level in accordance with the switching of the potential of the data signal. The control circuit 5 has been omitted in FIG. 6; however, output is also performed for the control signals /Sel(1), /Sel(2), and /Sel(3) which have an inverse logic relationship with the control signals Sel(1), Sel(2), and Sel(3). In this manner, in the demultiplexer 30, the transmission gates 34 in each group are turned on in order of the left end column, the center column, and the right end column, respectively.

Figure 10:
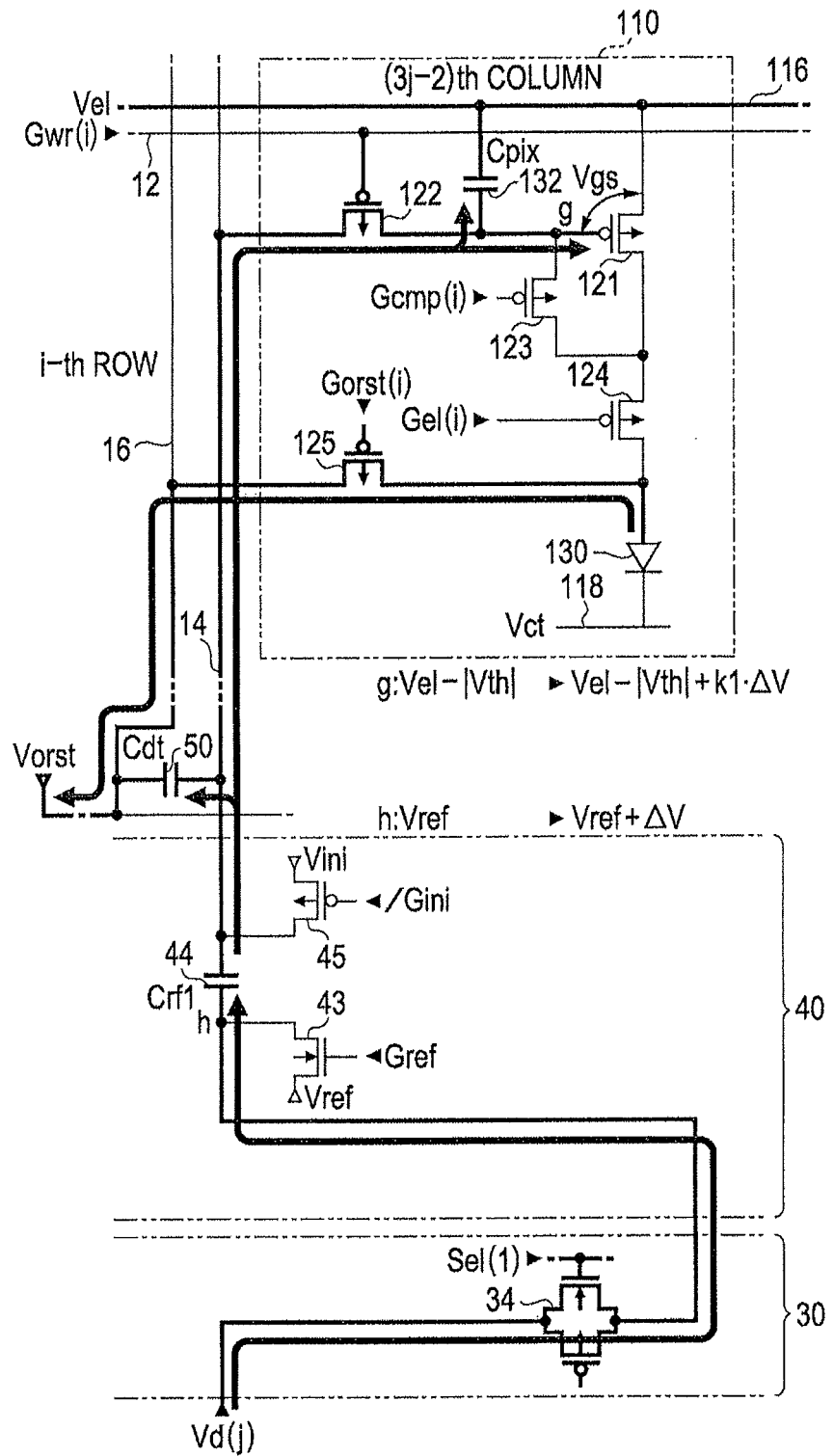
FIG. 10 is an explanatory diagram of operations of the same electro-optical device.

Here, when the transmission gate 34 of the left end column is turned on by the control signals Sel(1), and /Sel(1), as shown in FIG. 10, the node h which is the other end of the storage capacitor 44 is changed from the potential Vref fixed in the initialization period and the compensation period to the potential of the data signal Vd(j), that is, to a potential according to the gradation level of pixels of the i row (3j-2) column. The potential change amount of the node h at this time is set as ΔV and the potential after the change is set to be expressed as (Vref+ΔV).

Meanwhile, since the gate node g is connected to one end of the storage capacitor 44 through the data lines 14, it has a value (Vel−|Vth|+k1·ΔV) shifted upwards from the potential (Vel−|Vth|) in the compensation period by a value in which the potential change amount ΔV of the node h is multiplied by the capacitance ratio k1 only. At this time, the voltage Vgs of the transistor 121 becomes a value (|Vth|−k1·ΔV) in which the shifting amount of the increased potential of the gate node g only is subtracted from the threshold voltage |Vth|.

Here, the capacitance ratio k1 is Crf1/(Cdt+Crf1). Strictly speaking, the capacitance Cpix of the storage capacitor 132 must also be considered; however, since the capacitance Cpix is set so as to become sufficiently small in comparison with the capacities Crf1 and Cdt, it has been ignored.

Figure 11:
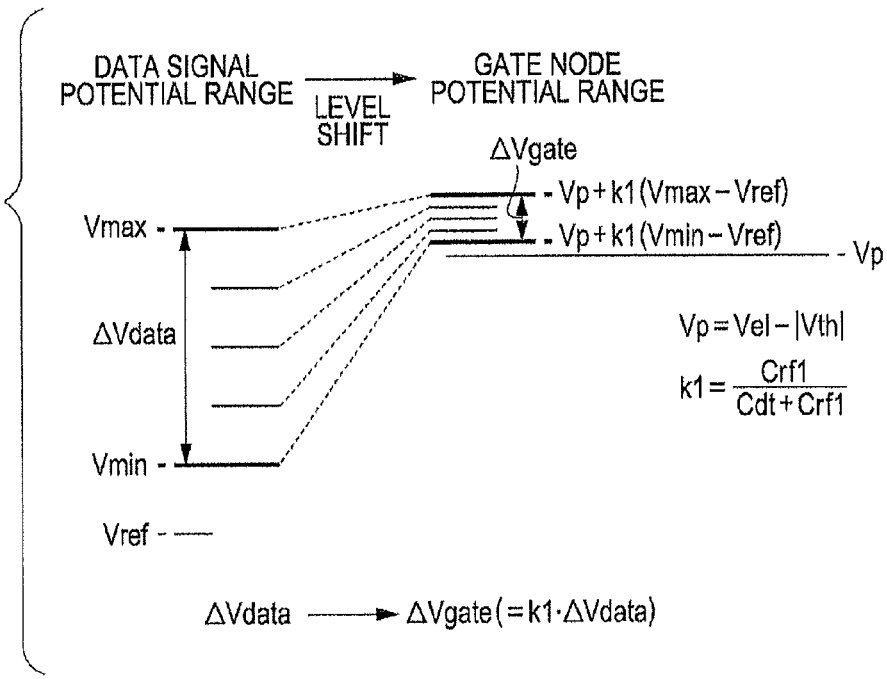
FIG. 11 is a diagram showing amplitude compression of a data signal in the same electro-optical device.

FIG. 11 is a view showing the relationship between the potential of the data signal and the potential of the gate node g in the writing period. The data signal supplied from the control circuit 5 can take a potential range of from the minimum value Vmin to the maximum value Vmax according to the gradation level of the pixels as described above. In the present embodiment, the data signals are not written directly to the gate node g, but are level-shifted as shown in the drawing and written to the gate node g.

At this time, the potential range ΔVgate of the gate node g is compressed to a value in which the potential range ΔVdata (=Vmax−Vmin) of the data signal is multiplied by the capacitance ratio k1. For example, when the capacities of the storage capacitors 44 and 50 are set so that Crf1:Cdt=1:9, it is possible to compress the potential range ΔVgate of the gate node g to ⅒ of the potential range ΔVdata of the data signal.

In addition, regarding in which direction and to what extent the potential range ΔVgate of the gate node g is shifted with respect to the potential range ΔVdata of the data signal, determination can be made with the potential Vp (Vel−|Vth|), and Vref. This is because the potential range ΔVdata of the data signal is compressed by the capacitance ratio k1 based on the potential Vref and one in which the compression range is shifted based on the potential Vp becomes the potential range ΔVgate of the gate node g.

In the writing period of such an i-th row, a potential (Vel−|Vth|+k1·ΔV) shifted from a potential (Vel−|Vth|) in the compensation period by an amount in which the potential change amount ΔV of the node h is multiplied by the capacitance ratio k1 is written to the gate node g of the pixel circuit 110 of the i-th row.

Eventually, the scanning signal Gwr(i) becomes the H level and the transistor 122 is turned off. In this manner, the writing period is finished and the potential of the gate node g is confirmed at the shifted value.

Light-Emitting Period

After the writing period of the i-th row is finished, the light-emitting period is reached during the single horizontal scanning period. In this light-emitting period, since the control signal Gel(i) as described above becomes the L level, the transistors 124 in the pixel circuits 110 of the i row (3j-2) columns are turned on. Since the voltage Vgs between the gate and the source is (|Vth|−k1·ΔV), as shown in the previous FIG. 7, the current according to the gradation level is supplied to the OLED 130 in a state where the threshold voltage of the transistor 121 is compensated.

Such an operation is performed in parallel in terms of time in the scanning period of the i row and the also in the other pixel circuits 110 of the i-th row other than the pixel circuits 110 of the (3j-2)-th column. In addition, such an operation of the i-th row is in practice performed in the order of 1, 2, 3, . . . , (m-1), and m-th row in the period of one frame, and is repeated for each frame.

Effect of the First Embodiment

In a case where the electro-optical device is provided on a silicon integrated circuit and the pixel circuit is miniaturized, it is not possible to increase the capacitance Cpix of the storage capacitor 132 provided in the pixel circuit 110. In particular, the present embodiment determines the potential of the gate node g in the writing period based on the capacitance Cdt of the storage capacitor 50 and the capacitance Crf1 of the storage capacitor 44. Then, in the subsequent light-emitting period, the potential of the gate node g is maintained by the storage capacitor 132. In other words, since the storage capacitor 132 is nothing more than one for maintaining the potential of the gate node g, the capacitance Cpix of the storage capacitor 132 is set to be made smaller.

However, in a case where the leakage current flowing from the storage capacitor 132 to the N well 160 is large, the storage capacitor 132 cannot maintain the potential of the gate node g and current of an accurate magnitude according to the gradation level is not supplied to the OLED 130. In particular, in a case where the capacitance Cpix of the storage capacitor 132 is small as in the present embodiment, the influence of the leakage current with respect to the potential of the gate node g is large. Thus, the size of the leakage current is a value according to the contact area of the P type diffusion layer P2 and the N wells 160.

In the present embodiment, by providing a P type diffusion layer P2 which is a common diffusion layer, the leakage current is prevented from becoming large, and it is possible for the transistor 121 to supply a current of an accurate magnitude according to the gradation level with respect to the OLED 130.

Here, in order to explain that the configuration of the pixel circuits 110 according to the present embodiment has an effect of reducing the size of the leakage current, description will be given of a configuration of a pixel circuit 110a according to a comparative example.

Figure 12:
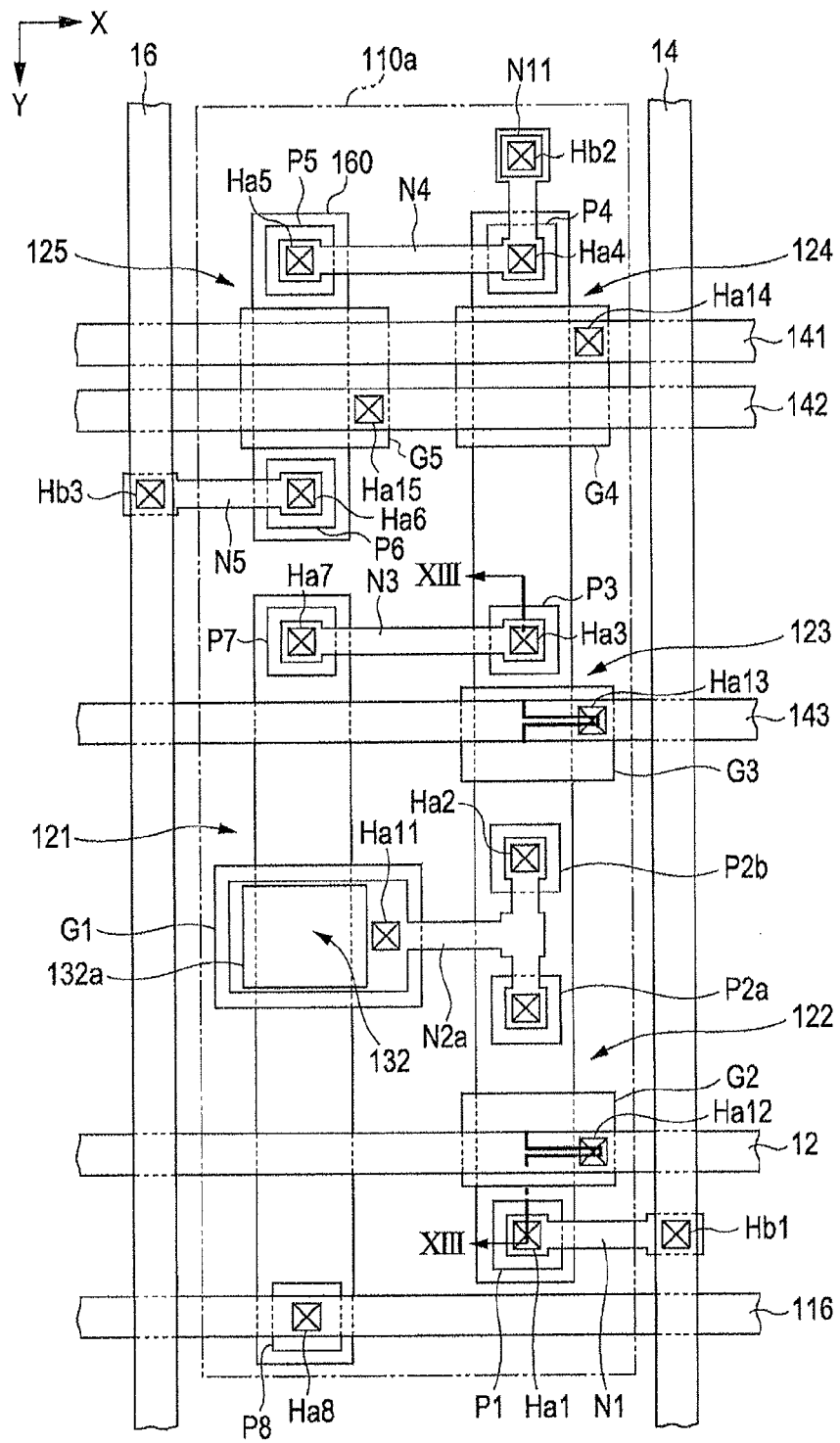
FIG. 12 is a plan view showing a structure of an electro-optical device according to a comparative example.
Figure 13:
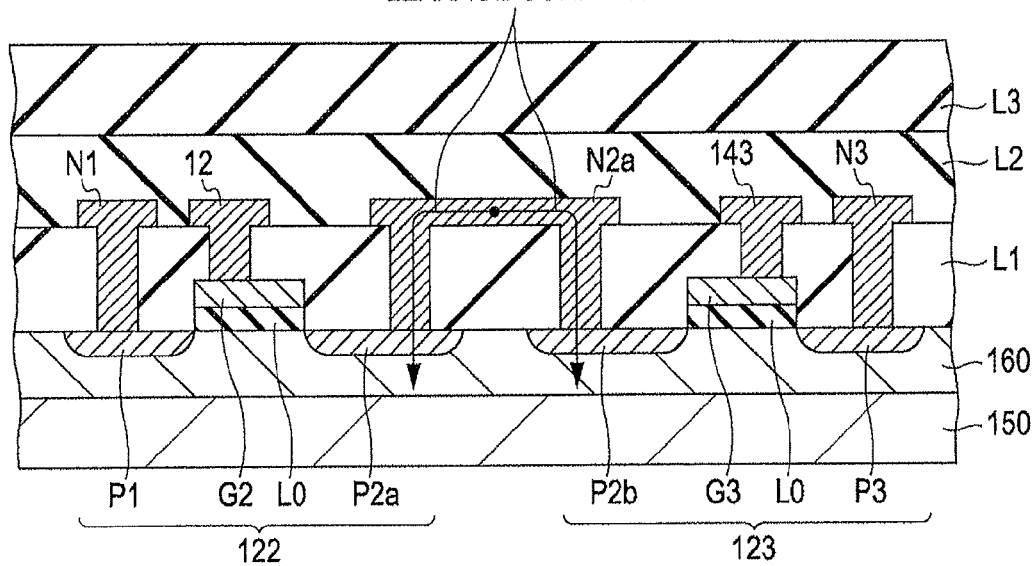
FIG. 13 is a partial cross-sectional view showing a structure of an electro-optical device according to a comparative example.

FIG. 12 is a plan view showing the configuration of the pixel circuit 110a according to the comparative example, and FIG. 13 is a partial cross-sectional view cut away at the line XIII-XIII in FIG. 12. As shown in FIG. 12, in the pixel circuit 110a, one of the source or the drain of the transistor 122 is formed by the P type diffusion layer P2a and one of the source or the drain of the transistor 123 is formed by the P type diffusion layer P2b. In such a case, the charge held by the storage capacitor 132 leaks from both of the P type diffusion layer P2a and the P type diffusion layer P2b through the relay node N2a.

In contrast, in the present embodiment, one of the source or the drain of the transistor 122 and one of the source or the drain of the transistor 123 are formed by a P type diffusion layer P2 which is a common diffusion layer. That is, the contact area between the P-type diffusion layer P2 and the N wells 160 according to the present embodiment is approximately half in comparison with the sum of the contact area of the P-type diffusion layer P2a and the N wells 160 and the contact area of the P-type diffusion layer P2b and the N wells 160 in the comparative example. Therefore, the leakage current generated in a pixel circuit 110 according to the present embodiment can be suppressed to a size of approximately half of the leakage current generated in the pixel circuit 110a according to the comparative example.

In this manner, since it is possible to reduce the leakage current flowing from the storage capacitor 132 to the N wells 160 in the pixel circuit 110 according to the present embodiment, it is possible to keep the deterioration of the display quality caused by the leakage current to a minimum.

Here, in the present embodiment, since one of the source or the drain of the transistor 122 and one of the source or the drain of the transistor 123 are formed by a common P type diffusion layer P2, it is possible to miniaturize the pixel circuit 110.

In addition, in this embodiment, the P type diffusion layer P2, the gate node G1, and the connection wiring are provided at positions intersecting with the center line Mid. In this manner, the gap between the P type diffusion layer P2, the gate node G1, and the connection wiring and the scanning lines 12 and the signal lines 143 is increased, whereby a parasitic capacitance on the capacitance therebetween can be prevented.

That is, the present embodiment, the influence of potential fluctuations generated at the scanning lines 12 and the signal lines 143 on the potential of the gate node g can be minimized, and it is possible to control the current supplied to the OLED 130 with high precision.

In addition, according to the present embodiment, since the potential range ΔVgate in the gate node g is narrowed with respect to the potential range ΔVdata of the data signal, even if the data signal is not cut up with fine precision, it is possible to apply a voltage reflecting the gradation level between the gate and source of the transistor 121. For this reason, even in a case where a small current flowing through the OLED 130 with respect to changes of the voltage Vgs between the gate and the source of the transistor 121 in the fine pixel circuit 110 is changed to a relatively large extent, it is possible to control the current supplied to the OLED 130 with high precision.

In addition, between the data lines 14 shown by a broken line in FIG. 3 and the gate node g in the pixel circuit 110 there is a parasitic capacitance Cprs in practice. For this reason, if the potential change range of the data line 14 is large, there is propagation to the gate node g through the capacitance Cprs, whereby so-called cross-talk, non-uniformity, or the like is generated and the display quality is deteriorated. The influence of the capacitance Cprs is remarkably apparent when the pixel circuit 110 is miniaturized.

In contrast, in the present embodiment, since the potential change range of the data lines 14 is also narrowed with respect to the potential range ΔVdata of the data signal, it is possible to suppress the influence through the capacitance Cprs.

According to the present embodiment, since it is possible to preserve a period which is longer than the scanning period, for example, 2 horizontal scanning periods, as the period in which the transistor 125 is turned on, that is, the reset period of the OLED 130, it is possible to sufficiently initialize the voltage held in the parasitic capacitance of the OLED 130 in the light-emitting period.

In addition, according to the present embodiment, in the current Ids supplied to the OLED 130 by the transistor 121, the influence of the threshold voltage is canceled out. For this reason, according to the present embodiment, even if the threshold voltage of the transistor 121 varies for each pixel circuit 110, since the variations are compensated and the current according to the gradation level is supplied to the OLED 130, the generation of display non-uniformity adversely affecting the uniformity of the display screen is suppressed and, as a result, a high-quality display is possible.

Figure 14:
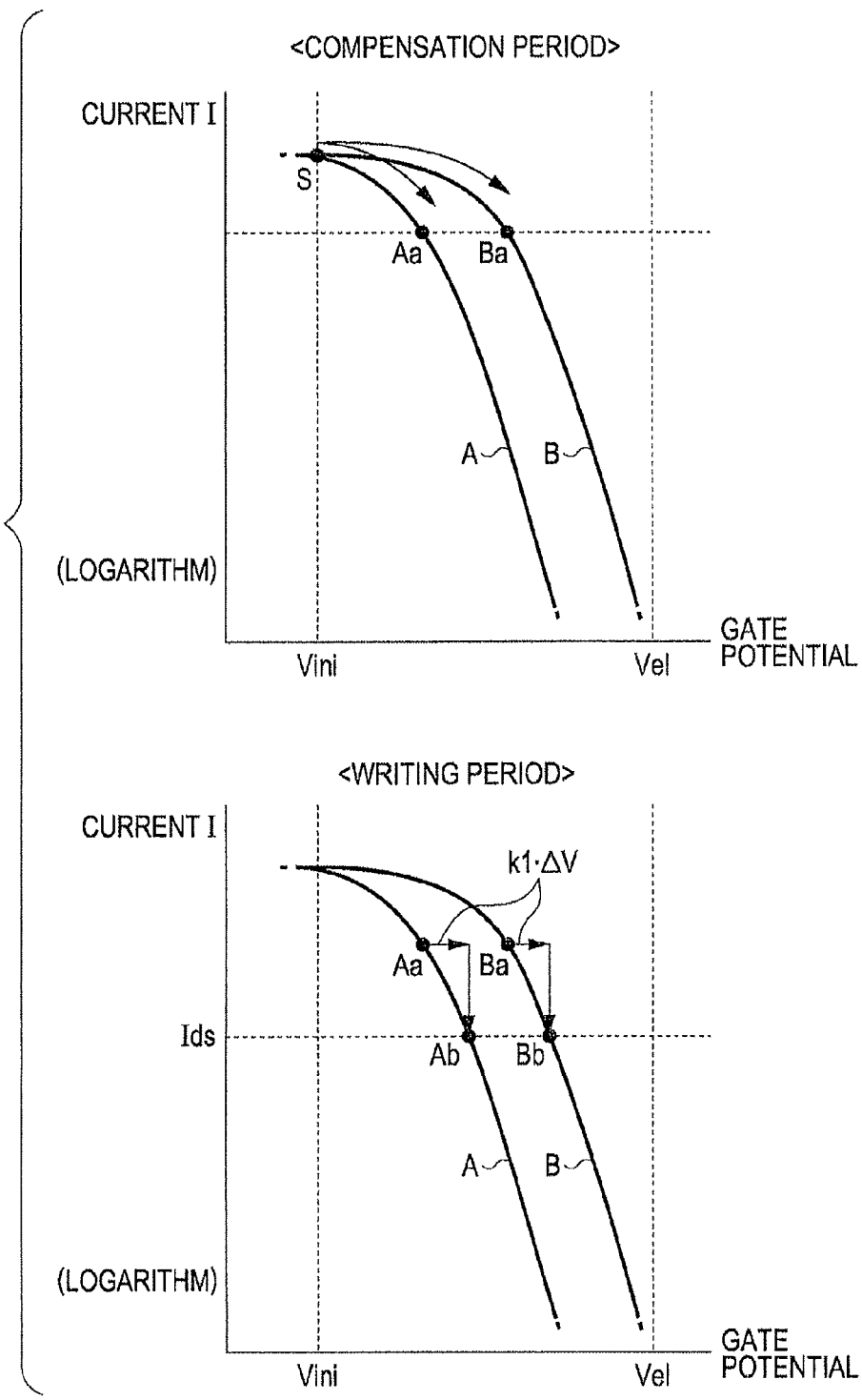
FIG. 14 is a diagram showing characteristics of a transistor in the electro-optical device according to the first embodiment of the invention.

Description will be given of this cancelling out with reference to FIG. 14. As shown in this drawing, in order to control the small current supplied to the OLED 130, the transistor 121 operates in a weak inversion region (sub-threshold region).

In the drawing, A illustrates a transistor for which the threshold voltage |Vth| is large and B illustrates a transistor for which the threshold voltage |Vth| is small, respectively. Here, in FIG. 14, the voltage Vgs between the gate and the source is the difference between the characteristic shown by the solid line and the potential Vel. Further, in FIG. 14, the current of the vertical scale is shown by a logarithm in which the direction from the source toward the drain is set as positive (up).

The gate node g in the compensation period becomes a potential (Vel−|Vth|) from the potential Vini. For this reason, for the transistor A in which the threshold voltage |Vth| is large, the operation point moves from S to Aa while, for the transistor B in which the threshold voltage |Vth| is small, the operation point moves from S to Ba.

Next, In a case where the potentials of the data signals to the pixel circuits 110 to which the two transistors belong are the same, that is, in a case where the same gradation level is indicated, in the writing period, the potential shift amounts from the operation points Aa and Ba are both the same k1·ΔV. For this reason, for transistor A, the operation point moves from Aa to Ab, and for transistor B, the operation point moves from Ba to Bb; however, the currents at the operation points after the potential shift are aligned at almost the same Ids for both the transistors A and B.

Second Embodiment

In the first embodiment, a configuration is adopted in which data signals are directly supplied by the demultiplexer 30 to the other ends of the storage capacitors 44 of each column, that is, to the nodes h. For this reason, in the scanning period of each row, since the period in which the data signals are supplied by the control circuit 5 is equal to the writing period, the time constraints are large.

Next, description will be given of the second embodiment in which it is possible to relax such time constraints. Here, in the following, in order to avoid duplication of explanation, description will be given with a focus on the parts which are different to the first embodiment.

Figure 15:
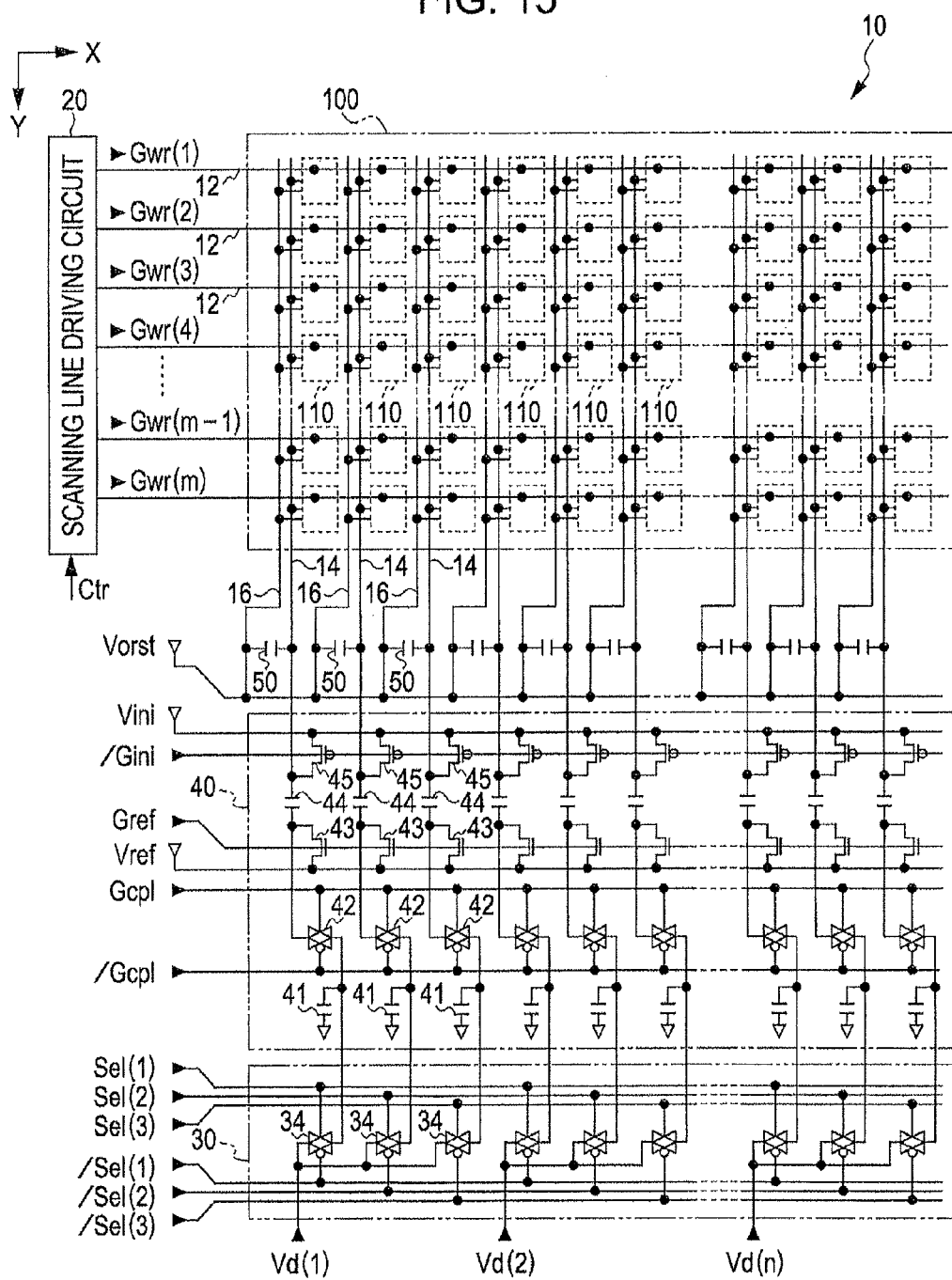
FIG. 15 is a diagram showing the configuration of the electro-optical device according to the second embodiment.

FIG. 15 is a view showing a configuration of an electro-optical device 10 according to the second embodiment.

The points where the second embodiment shown in the drawing is different to the first embodiment shown in FIG. 2 are mainly the points that a storage capacitor 41 and a transmission gate 42 are provided in each column of the level shift circuit 40.

In detail, the transmission gates 42 in each column are electrically interposed between the output ends of the transmission gate 34 and the other ends of the storage capacitor 44. That is, the input end of the transmission gate 42 is connected to the output end of the transmission gate 34, and the output end of the transmission gate 42 is connected to the other end of the storage capacitor 44. For this reason, the transmission gate 42 functions as a first switch.

Here, the transmission gates 42 of each column are turned on as a group when the control signal Gcpl supplied from the control circuit 5 is the H level (when the control signal /Gcpl is the L level).

On the other hand, the transmission gate 34 in the demultiplexer 30 functions as a second switch.

In addition, one end of the storage capacitors 41 in each column is connected to the output end of transmission gate 34 (input end of the transmission gate 42), and the other end of the storage capacitors 41 is grounded in common at a fixed potential, for example, a potential Vss. Although omitted from FIG. 15, the capacitance of the storage capacitor 41 is set as Crf2. Here, the potential Vss is equivalent to the L level of the scanning signals or control signals, which are logic signals.

Operation of the Second Embodiment

Figure 16:
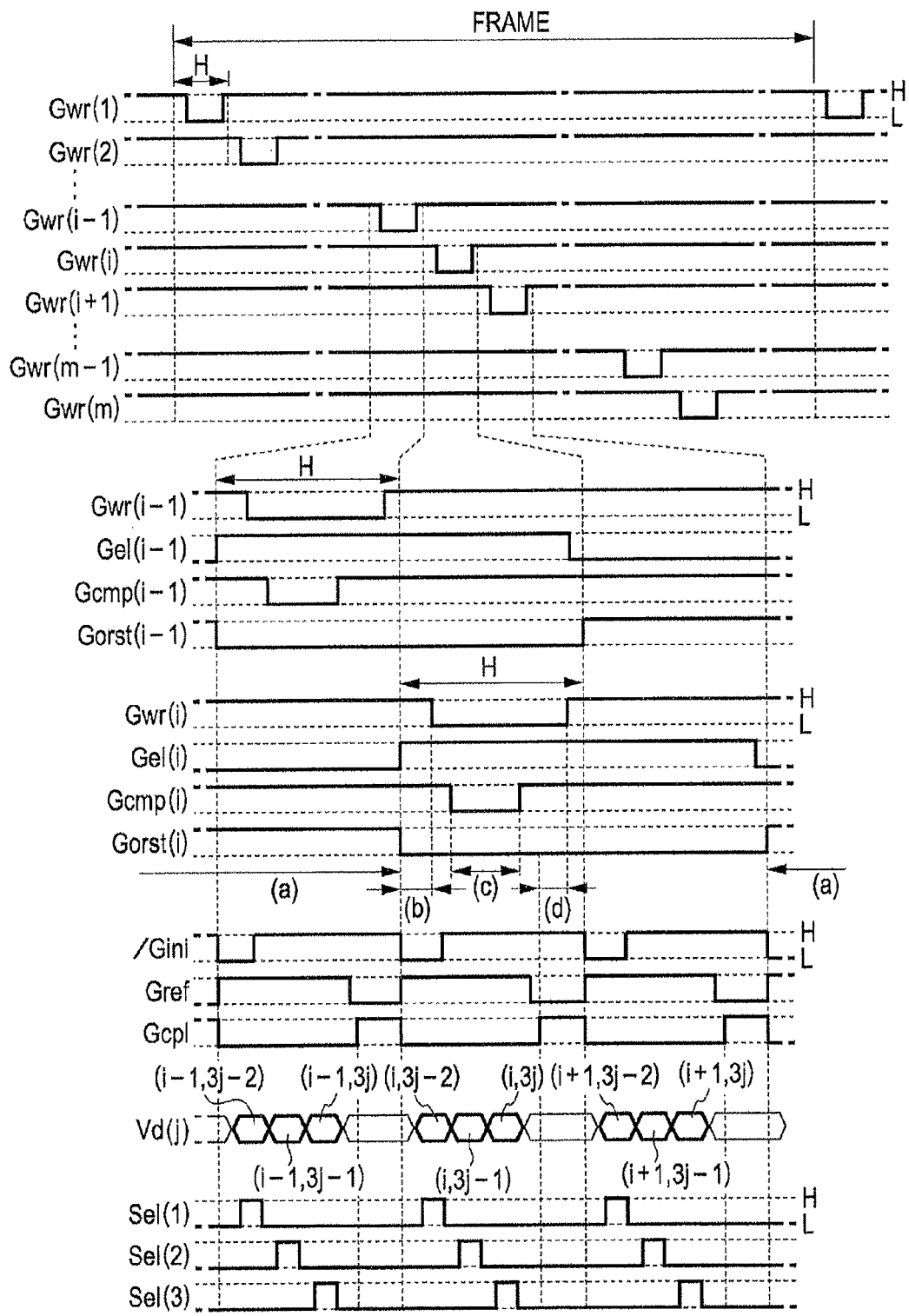
FIG. 16 is a timing chart showing operations of the same electro-optical device.

Description will be given of the operation of the electro-optical device 10 according to the second embodiment with reference to FIG. 16. FIG. 16 is a timing chart for illustrating the operation of the second embodiment.

As shown in the drawing, the point that the scanning signals Gwr(1) to Gwr(m) are sequentially switched to the L level and, in the period of one frame, 1 to m rows of scanning lines 12 are scanned in order for each single horizontal scanning period (H), is the same as the first embodiment. Further, in the second embodiment, the point that the scanning period of the i row follows the order of an initialization period shown by (b), a compensation period shown by (c), and a writing period shown by (d) is also the same as the first embodiment. Here, the writing period of (d) in the second embodiment is a period from the time the control signal Gcpl changes from the L to the H level (time when the control signal /Gcpl has become the L level) to the time when the scanning signal changes from the L to the H level.

In the second embodiment, similarly to the first embodiment, regarding the chronological order, a cycle of (light-emitting period)->initialization period->compensation period->writing period->(light-emitting period) is repeated. However, in the second embodiment, in comparison with the first embodiment, the supply period of the data signal is not equal to the writing period, and there is a difference in the point that the supply of the data signal precedes the writing period. In detail, the point that, in the second embodiment, the data signal can be supplied across the initialization period of (a) and the compensation period of (b) is different from the first embodiment.

Light-Emitting Period

In the second embodiment, as shown in FIG. 16, the scanning signal Gwr(i) in the light-emitting period of the i-th row is the H level, and, the control signal Gel(i) is the L level, and the control signals Gcmp(i) and Gorst(i) are the H level.

Figure 17:
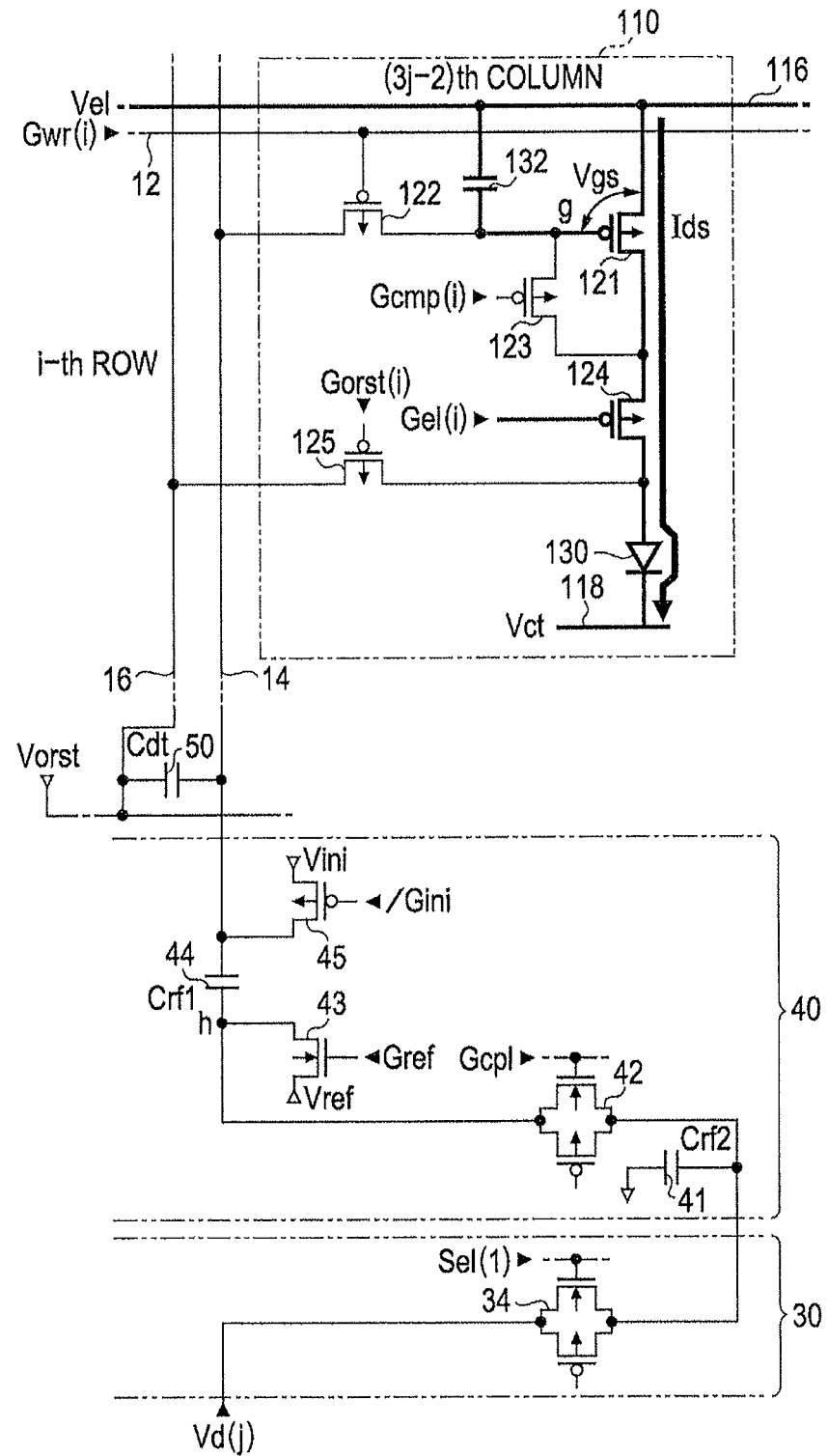
FIG. 17 is an explanatory diagram of operations of the same electro-optical device.

For this reason, in the pixel circuit 110 of i row (3j-2) column as shown in FIG. 17, since the transistor 124 is turned on while the transistors 122, 123, and 125 are turned off, the operation of the pixel circuit 110 is basically the same as the first embodiment. In other words, the transistor 121 supplies a current Ids according to the voltage Vgs between the gate and the source to the OLED 130.

Initialization Period

Upon reaching the scanning period of the i-th row, first, the initialization period of (b) is started.

In the initialization period in the second embodiment, in comparison with the light-emitting period, the control signal Gel(i) is changed to the H level and the control signal Gorst(i) is changed to the L level, respectively.

Figure 18:
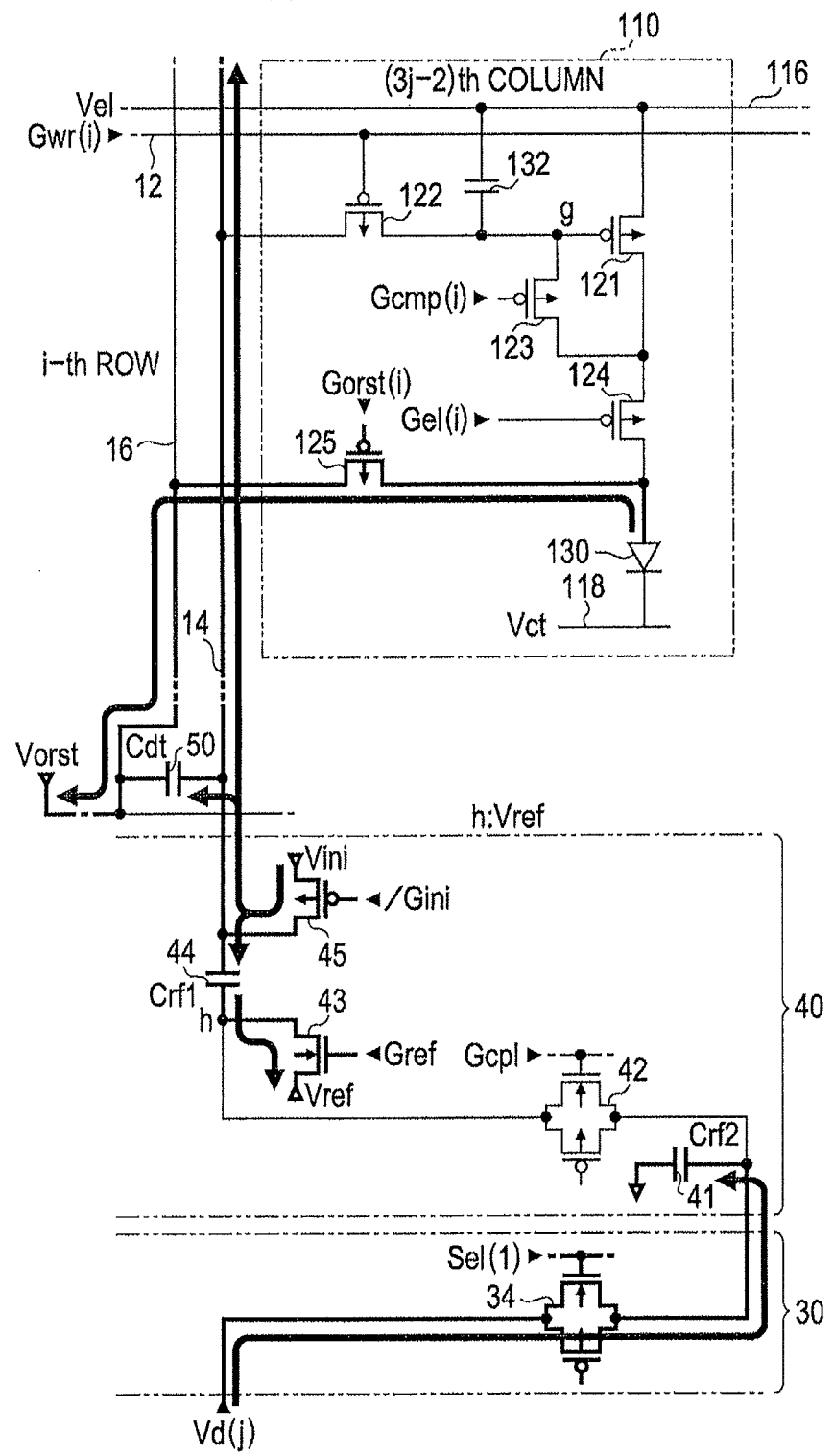
FIG. 18 is an explanatory diagram of operations of the same electro-optical device.

For this reason, as shown in FIG. 18, in the pixel circuit 110 of the i row (3j-2) column, the transistor 124 is turned off and the transistor 125 is turned on. In this manner, since the path of the current supplied to the OLED 130 is interrupted and the anodes of the OLED 130 are reset to the potential Vorst by the turning on of the transistor 124, the operation of the pixel circuit 110 is basically the same as the first embodiment.

Meanwhile, in the initialization period in the second embodiment, the control signal /Gini becomes the L level, the control signal Gref becomes the H level, and the control signal Gcpl becomes the L level. For this reason, in the level shift circuit 40, the transistors 45 and 43 are respectively turned on as shown in FIG. 18 and the transmission gate 42 is turned off. Accordingly, the data line 14 which is one end of the storage capacitor 44 is initialized to the potential Vini and the node h which is the other end of the storage capacitor 44 is initialized to the potential Vref, respectively.

The potential Vref in the second embodiment is set to a value such that the potential of the node h in the subsequent writing period can be increased with respect to the potential which can be taken by the data signals Vd(1) to Vd(n), similarly to the first embodiment.

As described above, the control circuit 5 in the second embodiment supplies data signals across the initialization period and the compensation period. That is, for a j numbered group, the control circuit 5 switches the data signals Vd(j) in order to a potential according to the gradation level of pixels of the i row (3j-2) column, the i row (3j-1) column, and the i row (3j) column while setting the control signals Sel(1), Sel(2), and Sel(3) in order exclusively to the H level in accordance with the switching of the potential of the data signal. In this manner, in the demultiplexer 30, the transmission gates 34 in each group are turned on in order of the left end column, the center column, and the right end column, respectively.

Here, in the initialization period, in a case where the transmission gate 34 of the left end side belonging to the j-numbered group is turned on by the control signal Sel(1), as shown in FIG. 18, since the data signal Vd(j) is supplied to one end of the storage capacitor 41, the data signal is held by the storage capacitor 41.

Compensation Period

In the scanning period of the i-th row, the compensation period of (c) is next. In the compensation period in the second embodiment, in comparison with the initialization period, the scanning signal Gwr(i) is changed to the L level and the control signal Gcmp(i) is changed to the L level, respectively.

Figure 19:
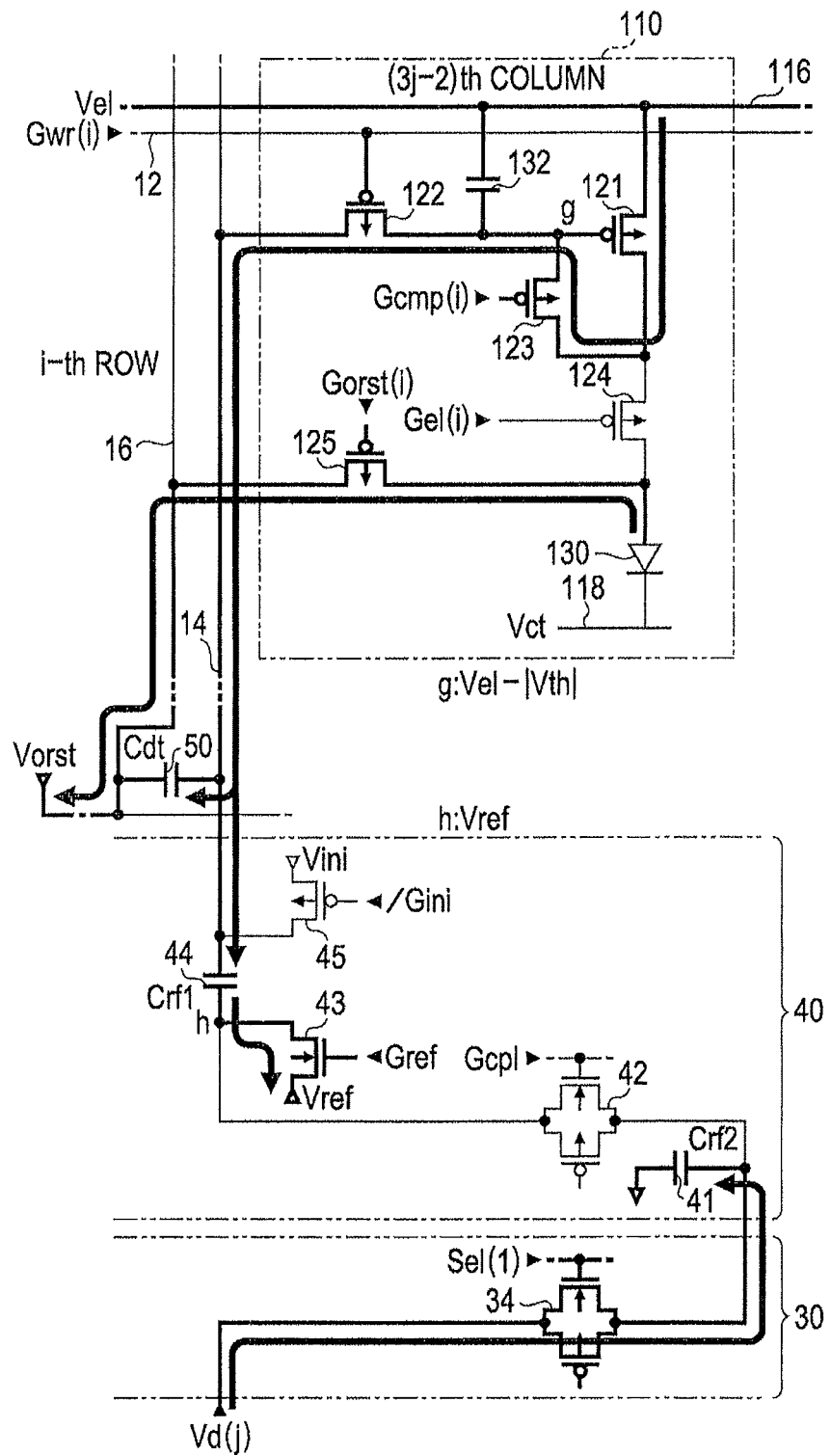
FIG. 19 is an explanatory diagram of operations of the same electro-optical device.

For this reason, as shown in FIG. 19, the transistor 122 is turned on in the pixel circuit 110 of the i row (3j-2) column) and the gate node g is electrically connected to the data lines 14, while the transistor 121 becomes a diode connection due to the turning on of the transistor 123.

Accordingly, since the current flows in the path of the power supply line 116->transistor 121->transistor 123->transistor 122->data line 14 of (3j-2)-th column, the gate node g is increased from the potential Vini and is eventually saturated at (Vel−|Vth|). Accordingly, even in the second embodiment, the storage capacitor 132 holds the threshold voltage |Vth| of the transistor 121 until the end of the compensation period is reached.

In the second embodiment, since the control signal /Gini becomes the H level in a state where the control signal Gref is maintained at the H level in the compensation period, the node h in the level shift circuit 40 is fixed at a potential Vref.

In addition, in the compensation period, in a case where the transmission gate 34 of the left end side belonging to the j-numbered group is turned on by the control signal Sel(1), as shown in FIG. 19, the data signal Vd(j) is held by the storage capacitor 41.

Here, in the initialization period, in a case where the transmission gate 34 of the left end column belonging to the j-numbered group are already turned on by the control signal Sel(1), in the compensation period, the transmission gate 34 is not turned on; however, there is no change in the point that the data signal Vd(j) is held by the storage capacitor 41.

In addition, when the compensation period is finished, since the control signal Gcmp(i) is the H level, the diode connection of the transistor 121 is canceled.

In the second embodiment, since the control signal Gref becomes the L level during the period from the end of the compensation period until the next writing period starts, the transistor 43 is turned off. For this reason, the path leading up to the gate node g in the pixel circuit 110 of i row (3j-2) column from the data line 14 of the (3j-2)-th column becomes a floating state, but the potential in the path is maintained at (Vel−|Vth|) by the storage capacitors 50 and 132.

Writing Period

Figure 20:
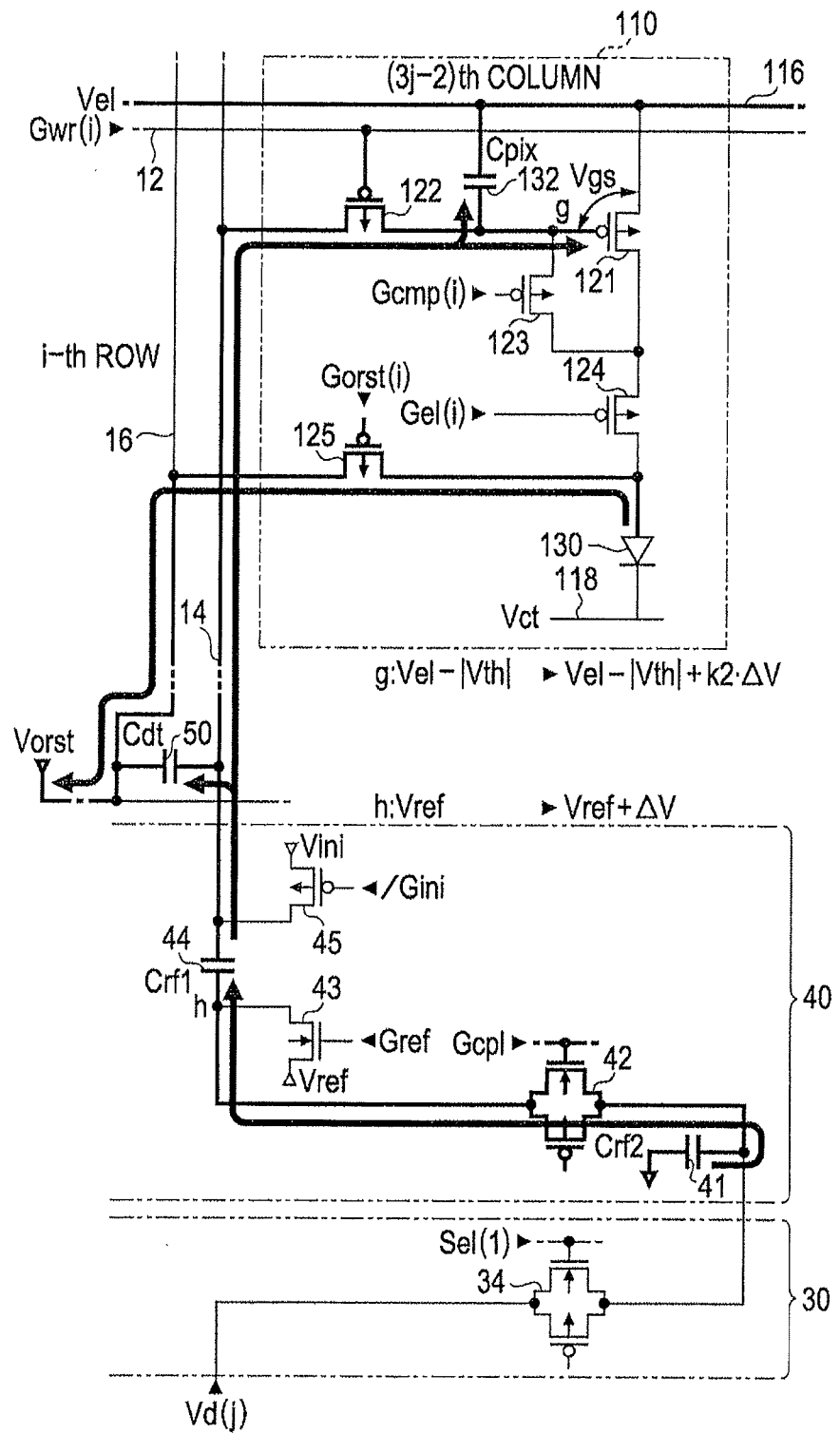
FIG. 20 is an explanatory diagram of operations of the same electro-optical device.

In the writing period in the second embodiment, the control signal Gcpl becomes the H level (control signal /Gcpl becomes the L level). For this reason, as shown in FIG. 20, since the transmission gate 42 is turned on in the level shift circuit 40, the data signal held by the storage capacitor 41 is supplied to the node h which is the other end of the storage capacitor 44. For this reason, the node h shifts from the potential Vref in the compensation period. In other words, the node h is changed to the potential (Vref+ΔV).

Meanwhile, since the gate node g is connected to one end of the storage capacitor 44 through the data lines 14, it has a value shifted upwards from the potential (Vel−|Vth|) in the compensation period by a value in which the potential change amount ΔV of the node h is multiplied by the capacitance ratio k2 only. In other words, the potential of the gate node g becomes a value (Vel−|Vth|+k2·ΔV) shifted upwards from the potential (Vel−|Vth|) in the compensation period by a value in which the potential change amount ΔV of the node h is multiplied by the capacitance ratio k2 only.

Here, in the second embodiment, the capacitance ratio k2 is the capacitance ratio of Cdt, Crf1, and Crf2. As described above, the capacitance Cpix of the storage capacitor 132 is ignored.

Further, at this time, the voltage Vgs of the transistor 121 becomes a value (|Vth|−k2·ΔV) decreased by the amount which the potential of the gate node g shifts upward from the threshold voltage |Vth|.

Light-Emitting Period

In the second embodiment, after the writing period of the i-th row is finished, the light-emitting period is reached during the single horizontal scanning period. In this light-emitting period, since the control signal Gel(i) as described above becomes the L level, the transistors 124 in the pixel circuits 110 of the i row (3j-2) columns are turned on.

The voltage Vgs between the gate and the source is (|Vth|−k2·ΔV) and is a value level-shifted according to the potential of the data signal from the threshold voltage of the transistor 121. For this reason, as shown in the previous FIG. 17, the current according to the gradation level is supplied to the OLED 130 in a state where the threshold voltage of the transistor 121 is compensated.

Such an operation is performed in parallel in terms of time in the scanning period of the i row and the also in the other pixel circuits 110 of the i-th row other than the pixel circuits 110 of the (3j-2)-th column. In addition, such an operation of the i-th row is in practice performed in the order of 1, 2, 3, . . . , (m-1), and m-th row in the period of one frame, and is repeated for each frame.

Effect of the Second Embodiment

According to the second embodiment, similarly to the first embodiment, even in a case where a small current flowing through the OLED 130 with respect to changes of the voltage Vgs between the gate and the source of the transistor 121 in the fine pixel circuit 110 is changed to a relatively large extent, it is possible to control the current supplied to the OLED 130 with high precision.

According to the second embodiment, similarly to the first embodiment, as well as being able to sufficiently initialize the voltage held by the parasitic capacitance of the OLED 130 in the light-emitting period, even if the threshold voltage of the transistor 121 varies for each pixel circuit 110, the generation of display non-uniformity adversely affecting the uniformity of the display screen is suppressed and, as a result, a high-quality display is possible.

According to the second embodiment, an operation of holding the data signal supplied through the demultiplexer 30 from the control circuit 5 in the storage capacitor 41 is performed from the initialization period to the compensation period. For this reason, it is possible to relax the time constraints on the operations to be performed in one horizontal scanning period.

For example, since, as the voltage Vgs between the gate and the source in the compensation period approaches the threshold voltage, the current flowing in the transistor 121 deteriorates, time is required to bring the gate node g to the potential (Vel−|Vth|); however, in the second embodiment, it is possible to preserve a long compensation period as shown in FIG. 16 in comparison with the first embodiment. For this reason, according to the second embodiment, in comparison with the first embodiment, it is possible to compensate the variations of the threshold voltage of the transistor 121 with high precision.

In addition, it is possible to slow down the supply operation of the data signal.

Application and Modification Examples

The invention is not limited to embodiments such as the above-described embodiments and application examples, and, for example, various modifications are possible as described in the following. Further, one or a plurality of arbitrarily selected forms of the modifications described below can also be combined as appropriate.

Control Circuit

In the embodiment described above, the control circuit 5 supplying data signals is set as separate to the electro-optical device 10; however, the control circuit 5 may also be integrated in the silicon substrate with the scanning line driving circuit 20, the demultiplexer 30 and the level shift circuit 40.

Demultiplexer

In the above-described embodiments and modification examples, a configuration is adopted in which the data lines 14 are grouped in threes, the data lines 14 are selected in order in each group, and data signals are supplied; however, the number of data lines configuring a group may be 2 or may be 4 or more.

In addition, a configuration may be adopted in which the data signals are supplied in line order together to the data lines 14 of each column without grouping, that is, without using the demultiplexer 30.

Channel Type of Transistor

In the above-described embodiments and modification examples, the transistors 121 to 125 in the pixel circuits 110 are standardized as P channel types; however, they may be standardized as N channel types. Further, the P channel types and N channel types may be appropriately combined.

Storage Capacitor

In the above-described embodiments and modification examples, the potential of the gate node g and the data lines 14 is set through the storage capacitor 44 by supplying the data signal Vd(j) to the other end of the storage capacitor 44; however, the invention is not limited to such a form, and the potential of the gate node g may be set by supplying the data signal Vd(j) directly to the other end of the data lines 14. In such a case, the electro-optical device 10 need not be provided with the storage capacitor 44 (or the storage capacitor 41).

Pixel Circuit

In the above-described embodiments and modification examples, the P type diffusion layer P2, the gate node G1, and the connection wiring are arranged such that the first gap $\Delta y_1$ and the second gap $\Delta y_2$ are equal; however, the invention is not limited to such a form, and the P type diffusion layer P2, the gate node G1, and the connection wiring may be provided such that the value difference $|\Delta y_1 - \Delta y_2|$ between the first gap $\Delta y_1$ and the second gap $\Delta y_2$ becomes smaller than a predetermined tolerance.

Even in a case where the first gap $\Delta y_1$ and the second gap $\Delta y_2$ are different values, when the value difference $|\Delta y_1 - \Delta y_2|$ becomes smaller than a predetermined tolerance, the P type diffusion layer P2, the gate node G1, and the connection wiring are arranged at approximately equal distances from the scanning lines 12 and the signal lines 143. That is, in this case, since it is possible to increase the gap between the P type diffusion layer P2, the gate node G1, and the connection wiring, and the scanning lines 12 and the signal lines 143, the influence of potential fluctuations generated at the scanning lines 12 and the signal lines 143 on the potential of the gate node g can be minimized.

Other

In such embodiments, an OLED which is a light-emitting element has been exemplified as an electro-optical element; however, for example, it may be one emitting light at a luminance according to the current such as an inorganic light-emitting diode or an LED (Light Emitting Diode).

Electronic Apparatus

Next, description will be given of an electronic apparatus applying the electro-optical device 10 according to such embodiments or application examples. The electro-optical device 10 is for high-definition display applications with small pixels. Thus, description will be given taking a head mounted display as an example of the electronic apparatus.

Figure 21:
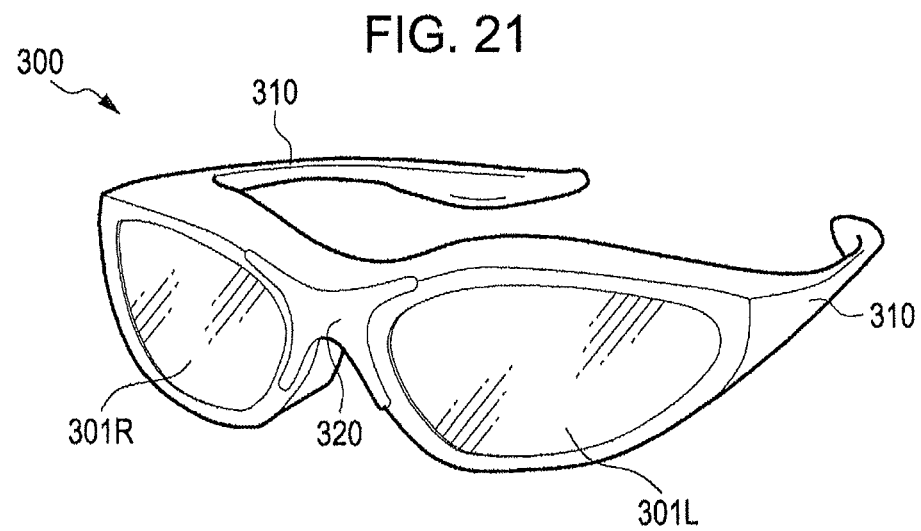
Figure 22:
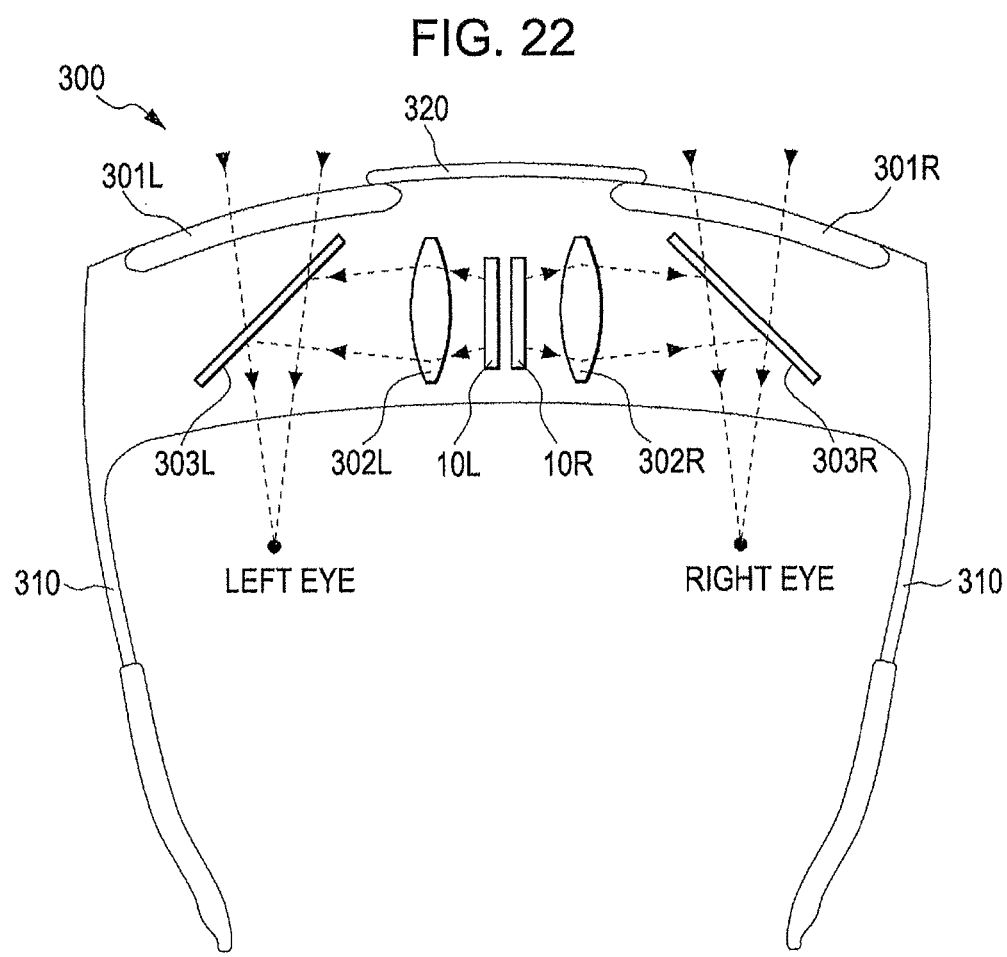
FIG. 22 is a view showing the optical configuration of the HMD.

FIG. 21 is a diagram showing the external appearance of a head mounted display and FIG. 22 is a diagram showing the optical configuration thereof.

First, as shown in FIG. 21, the head mounted display 300 includes temples 310, a bridge 320, and lenses 301L and 301LR, which are similar to normal glasses in terms of the external appearance. In addition, as shown in FIG. 22, in the head mounted display 300, at the far side (bottom side in the drawing) of the lenses 301L and 301R which are in the vicinity of the bridge 320, an electro-optical device 10L for left eye use and an electro-optical device 10R for right eye use are provided.

The image display surface of the electro-optical device 10L is arranged to be on the left side in FIG. 22. In this manner, the display image according to the electro-optical device 10L is emitted in the direction of 9 o'clock in the drawing through the optical lens 302L. A half mirror 303L reflects the display image according to the electro-optical device 10L in the 6 o'clock direction while allowing light incident from the 12 o'clock direction to pass therethrough.

The image display surface of the electro-optical device 10R is arranged so as to be on the right side opposite to the electro-optical device 10L. In this manner, the display image according to the electro-optical device 10R is emitted in the direction of 3 o'clock in the drawing through the optical lens 302R. A half mirror 303R reflects the display image according to the electro-optical device 10R in the 6 o'clock direction while allowing light incident from the 12 o'clock direction to pass therethrough.

In this configuration, the wearer of the head mounted display 300 can observe the display image according to the electro-optical devices 10L and 10R in a see-through state superimposed with the outside view.

Further, in the head mounted display 300, with parallax images for both eyes, when an image for the left eye is displayed on the electro-optical device 10L and an image for the right eye is displayed on the electro-optical device 10R, the wearer can be made to perceive the displayed image as though it had a sense of depth or a stereoscopic effect (3D display).

Here, in addition to the head mounted display 300, the electro-optical device 10 can also be applied to an electronic viewfinder of a video camera, a digital camera with interchangeable lenses, or the like.

The entire disclosure of Japanese Patent Application No. 2011-249815, filed Nov. 15, 2011 is expressly incorporated by reference herein.

What is claimed is:

1. An electro-optical device comprising:
   a power supply line;
   a light emitting element;
   a relay electrode;
   a first transistor controlling an electrical connection between the power supply line and the light emitting element, the first transistor having a gate electrode;
   a first insulating layer having a contact hole, the first insulating layer being provided between the gate electrode and the relay electrode;
   a second insulating layer provided on the relay electrode; and
   an electrode provided on the second insulating layer, the electrode being electrically connected to the power supply line,
   wherein the relay electrode is electrically connected to the gate electrode through the contact hole, and
   wherein a storage capacitor is formed by interposing the second insulating layer between the relay electrode and the electrode.

2. The electro-optical device according to claim 1, further comprising
   a second transistor through which the first gate of the first transistor is electrically connected to a data line while the second transistor is in an on-state, the second transistor having a second gate, a second drain, and a second source; and a third transistor through which the first gate of the first transistor is electrically connected to the first drain of the first transistor while the third transistor is in an on-state, the third transistor having a third gate, a third drain, and a third source.

3. The electro-optical device according to claim 2, wherein one of the second source and the second drain of the second transistor and one of the third source and the third drain of the third transistor are formed by a common diffusion layer.

4. The electro-optical device according to claim 1, further comprising a fourth transistor electrically connected between a potential line to which a predetermined potential is supplied and the light-emitting element.

5. The electro-optical device according to claim 1, further comprising a fifth transistor electrically connected between the first transistor and the light-emitting element.

6. An electronic apparatus comprising the electro-optical device according to claim 1.

7. An electronic apparatus comprising the electro-optical device according to claim 2.

8. An electronic apparatus comprising the electro-optical device according to claim 3.

9. An electronic apparatus comprising the electro-optical device according to claim 4.

10. An electronic apparatus comprising the electro-optical device according to claim 5.

* * * * *